(12) United States Patent
Shin et al.

(10) Patent No.: US 11,487,627 B2
(45) Date of Patent: Nov. 1, 2022

(54) STORAGE DEVICE AND METHOD OF OPERATING THE SAME

(71) Applicant: SK hynix Inc., Icheon (KR)

(72) Inventors: Young Kyun Shin, Seoul (KR); Keun Hyung Kim, Icheon (KR)

(73) Assignee: SK hynix Inc., Icheon (KR)

( * ) Notice: Subject to any disclaimer, the term of this patent is extended or adjusted under 35 U.S.C. 154(b) by 202 days.

(21) Appl. No.: 16/882,076

(22) Filed: May 22, 2020

(65) Prior Publication Data

US 2021/0182152 A1 Jun. 17, 2021

(30) Foreign Application Priority Data

Dec. 16, 2019 (KR) .................. 10-2019-0167784

(51) Int. Cl.
| | |
|---|---|
| G06F 11/14 | (2006.01) |
| G11C 16/04 | (2006.01) |
| G11C 16/10 | (2006.01) |
| G11C 16/26 | (2006.01) |
| G11C 29/00 | (2006.01) |

(52) U.S. Cl.
CPC ...... *G06F 11/1451* (2013.01); *G11C 16/0483* (2013.01); *G11C 16/10* (2013.01); *G11C 16/26* (2013.01); *G11C 29/70* (2013.01); *G11C 29/74* (2013.01); *G06F 2201/82* (2013.01)

(58) Field of Classification Search
None
See application file for complete search history.

(56) References Cited

U.S. PATENT DOCUMENTS

| | | | |
|---|---|---|---|
| 9,418,699 B1 | 8/2016 | Gibbons et al. | |
| 9,772,782 B2* | 9/2017 | Kowles | G06F 12/08 |
| 9,875,038 B2 | 1/2018 | Jang et al. | |
| 10,643,707 B2 | 5/2020 | Rajamani et al. | |
| 10,698,817 B2 | 6/2020 | Gharpure et al. | |
| 10,747,666 B2 | 8/2020 | Ishiyama | |
| 2006/0015683 A1 | 1/2006 | Ashmore et al. | |
| 2007/0150645 A1 | 6/2007 | Chandramouli et al. | |
| 2007/0280002 A1* | 12/2007 | Sudhindra Prasad | G11C 16/3427 365/185.29 |

(Continued)

FOREIGN PATENT DOCUMENTS

| | | |
|---|---|---|
| KR | 10-0825802 B1 | 4/2008 |
| KR | 1020110046243 A | 5/2011 |

(Continued)

OTHER PUBLICATIONS

Non-final Office Action for related U.S. Appl. No. 16/841,274, dated Jun. 24, 2021.

(Continued)

*Primary Examiner* — Guerrier Merant

(57) ABSTRACT

A storage device having improved data recovery performance includes a memory device including a first storage region and a second storage region, and a memory controller that controls the memory device. Before performing a write operation in the first storage region, the memory controller may backup data previously stored in the first storage region, based on a fail probability of the write operation to be performed in the first storage region. If the write operation fails, the previously-stored data may be recovered from where it was backed up.

20 Claims, 16 Drawing Sheets

(56) References Cited

U.S. PATENT DOCUMENTS

| | | |
|---|---|---|
| 2008/0282105 A1 | 11/2008 | Deenadhayalan et al. |
| 2009/0319716 A1 | 12/2009 | Nagadomi |
| 2010/0023682 A1 | 1/2010 | Lee et al. |
| 2010/0146193 A1 | 6/2010 | Jang et al. |
| 2010/0174870 A1 | 7/2010 | Banerjee |
| 2011/0099323 A1 | 4/2011 | Syu |
| 2011/0161563 A1 | 6/2011 | Chang et al. |
| 2011/0302446 A1 | 12/2011 | Becker-Szendy et al. |
| 2012/0072801 A1 | 3/2012 | Takeuchi et al. |
| 2012/0084484 A1 | 4/2012 | Post et al. |
| 2013/0080688 A1* | 3/2013 | Park ............ G06F 3/061 711/E12.008 |
| 2013/0173857 A1 | 7/2013 | Cheon et al. |
| 2014/0082265 A1 | 3/2014 | Cheng |
| 2014/0258588 A1 | 9/2014 | Tomlin et al. |
| 2014/0289355 A1 | 9/2014 | Imai |
| 2015/0046670 A1 | 2/2015 | Kim et al. |
| 2015/0205539 A1 | 7/2015 | Moon et al. |
| 2015/0347026 A1 | 12/2015 | Thomas |
| 2016/0342509 A1 | 11/2016 | Kotte et al. |
| 2017/0371575 A1* | 12/2017 | Park ............ G06F 12/0246 |
| 2018/0129453 A1 | 5/2018 | Kim |
| 2018/0239671 A1 | 8/2018 | Wei et al. |
| 2018/0357170 A1 | 12/2018 | Benisty |
| 2018/0364938 A1 | 12/2018 | Habbinga et al. |
| 2019/0065387 A1 | 2/2019 | Duzly et al. |
| 2019/0102250 A1 | 4/2019 | O'Krafka et al. |
| 2019/0129841 A1 | 5/2019 | Kanno |
| 2019/0187934 A1 | 6/2019 | Sicola et al. |
| 2019/0220416 A1 | 7/2019 | Jung et al. |
| 2019/0227735 A1 | 7/2019 | Shaked et al. |
| 2019/0250847 A1 | 8/2019 | Frolikov |
| 2019/0347204 A1 | 11/2019 | Du et al. |
| 2021/0056023 A1* | 2/2021 | Jin ............ G06F 12/0246 |
| 2021/0165579 A1 | 6/2021 | Bernat et al. |
| 2021/0248842 A1 | 8/2021 | Dittrich et al. |
| 2021/0303214 A1* | 9/2021 | Nakano ............ G06F 11/1068 |

FOREIGN PATENT DOCUMENTS

| | | |
|---|---|---|
| KR | 101449524 B1 | 10/2014 |
| KR | 101506675 B1 | 3/2015 |
| KR | 10-1636248 B1 | 7/2016 |
| KR | 1020180024615 A | 3/2018 |
| KR | 1020190060328 A | 6/2019 |

OTHER PUBLICATIONS

Non-Final Office Action for related U.S. Appl. No. 16/877,239, dated Apr. 16, 2021.

Notice of Allowance for related U.S. Appl. No. 16/841,274, dated Oct. 1, 2021.

Final Office Action for related U.S. Appl. No. 16/877,239, dated Oct. 14, 2021.

Notice of Allowance for related U.S. Appl. No. 16/847,555, dated Dec. 1, 2021.

Final Office Action for related U.S. Appl. No. 16/877,239, dated May 12, 2022.

Non-final Office Action for related U.S. Appl. No. 17/000,082, dated Aug. 5, 2022.

Non-final Office Action for related U.S. Appl. No. 16/877,239, dated Aug. 18, 2022.

* cited by examiner

STORAGE DEVICE AND METHOD OF OPERATING THE SAME

CROSS-REFERENCE TO RELATED APPLICATION

The present application claims priority under 35 U.S.C. § 119(a) to Korean patent application number 10-2019-0167784, filed on Dec. 16, 2019, in the Korean Intellectual Property Office, the entire disclosure of which is incorporated herein by reference.

BACKGROUND

1. Technical Field

The present disclosure relates to an electronic device, and more particularly, to a storage device and a method of operating the same.

2. Related Art

A storage device is a device that stores data under control of a host device such as a computer or a smartphone. A storage device may include a memory device in which data is stored and a memory controller controlling the memory device. Memory devices may be divided into volatile memory devices and non-volatile memory devices.

Volatile memory device are devices that store data only when power is supplied and lose the stored data when the power supply is cut off. Volatile memory devices include static random access memory (SRAM), dynamic random access memory (DRAM), and the like.

Non-volatile memory devices are devices that does not lose data even though power is cut off. Non-volatile memory devices include read only memory (ROM), programmable ROM (PROM), electrically programmable ROM (EPROM), electrically erasable and programmable ROM (EEPROM), flash memory, and the like.

SUMMARY

An embodiment of the present disclosure provides a storage device having improved data recovery performance and a method of operating the same.

A memory controller according to an embodiment of the present disclosure may include a pre-data storage configured to temporarily store data read from a memory device; a target data write controller configured to control the memory device to perform a write operation by storing data received from a host in a target location corresponding to a first subregion included in a first storage region of the memory device; and a pre-data manager configured to back up pre-data stored in a pre-data location to the pre-data storage before the write operation is performed, the pre-data location corresponding to a second subregion included in the first storage region.

A storage device according to an embodiment of the present disclosure may include a memory device including a first storage region and a second storage region; and a memory controller configured to control the memory device to back up data stored in the first storage region according to a fail probability of a write operation to be performed on the first storage region, and to perform the write operation.

A method of operating a storage device according to an embodiment of the present disclosure may include storing pre-data in a pre-data location, the pre-data location corresponding to a first subregion of the first storage region; determining a fail probability of a write operation for a target location, the target location corresponding to a second subregion of the first storage region after storing the pre-data; and backing up the pre-data stored in the pre-data location based on the fail probability.

The storage device and the method of operating the same according to the present technology provide improved data recovery performance.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

Hereinafter, an embodiment of the present disclosure will be described with reference to the accompanying drawings so that those skilled in the art may easily implement the technical spirit of the present disclosure.

Figure 1:
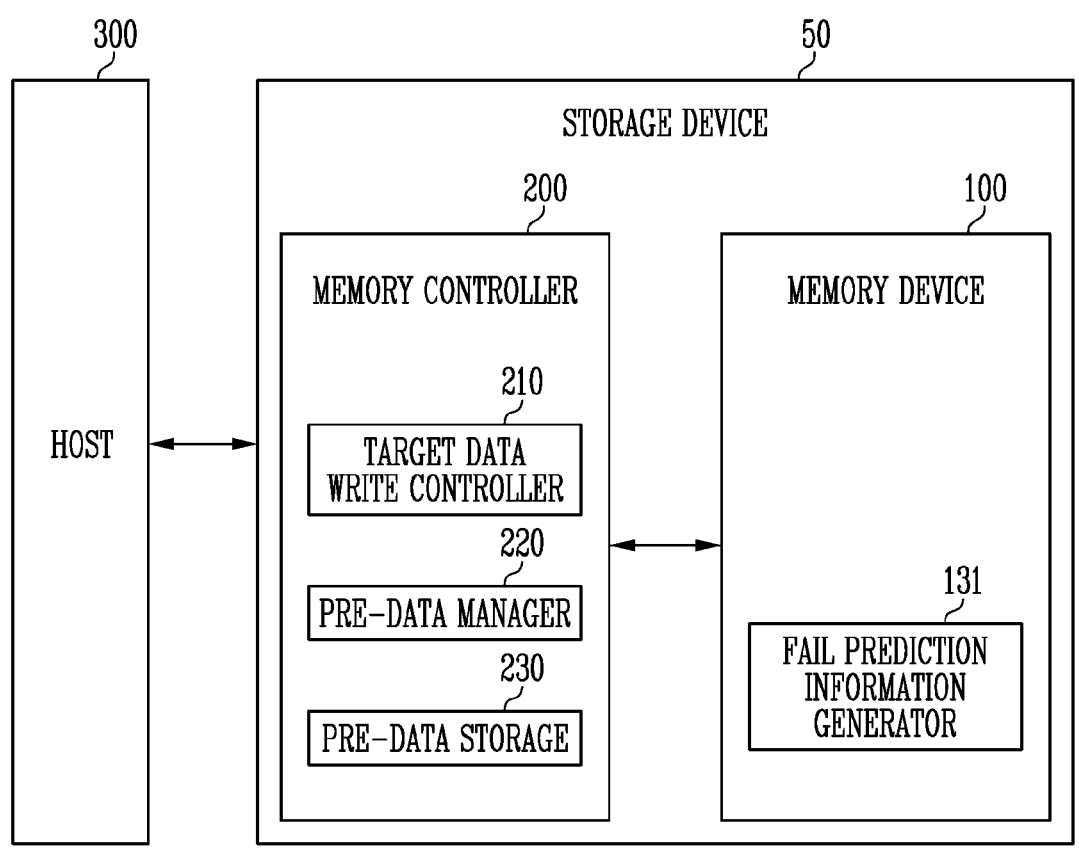
FIG. 1 illustrates a storage device according to an embodiment of the present disclosure.

FIG. 1 illustrates a storage device 50 according to an embodiment of the present disclosure.

The storage device 50 may include a memory device 100 and a memory controller 200 that controls an operation of the memory device.

The storage device 50 may be a device that stores data under control of a host 300 such as a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface that is a communication method with the host 300. For example, the storage device 50 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as any one of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates under control of the memory controller 200. The memory device 100 may include a memory cell array including a plurality of memory cells that store data.

Each of the memory cells may be configured as a single level cell (SLC) storing one data bit, a multi-level cell (MLC) storing two data bits, a triple level cell (TLC) storing three data bits, or a quad level cell (QLC) storing four data bits.

The memory cell array may include a plurality of memory blocks. Each memory block may include a plurality of pages, and each page may include a plurality of memory cells. In an embodiment, the page may be a unit for storing data in the memory device 100 or reading data stored in the memory device 100. The memory block may be a unit for erasing data.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), a spin transfer torque random access memory (STT-RAM), or the like. In the present specification, for convenience of description, it is assumed that the memory device 100 is a NAND flash memory, and in particular may be a 3D NAND flash memory where one physical word line may drive a plurality of pages.

The memory device 100 may receive a command and an address from the memory controller 200. The memory device 100 is configured to access a portion of the memory selected by the received address of the memory cell array.

Accessing the selected portion means performing an operation corresponding to the received command on the selected portion. For example, the memory device 100 may perform a write operation (program operation), a read operation, or an erase operation. During the program operation, the portion selected may be a page, and the memory device 100 may program data to the page selected by the address. During the read operation, the portion selected may be a page, and the memory device 100 may read data from the page selected by the address. During the erase operation, the portion selected may be a block, and the memory device 100 may erase data stored in the block selected by the address.

In an embodiment, the memory device 100 may include a fail prediction information generator 131.

The fail prediction information generator 131 may receive a fail prediction request for determining a program fail probability from the memory controller 200 and generate fail prediction information. The fail prediction information may be information indicating a program fail probability.

Specifically, the fail prediction information generator 131 may generate the fail prediction information based on a resistance component of a bit line or a word line connected to a storage region to be programmed. The fail prediction information generator 131 may measure the current flowing through bit lines and/or word lines connected to memory cells included in the storage region, and determine a value of the resistance component based on the measured current. For example, when the value of the measured current is less than a reference value, the fail prediction information generator 131 may determine that the resistance component is relatively large, and transmit fail prediction information indicating that the program fail probability is relatively high to the memory controller 200. When the value of the measured current is equal to or greater than the reference value, the fail prediction information generator 131 may determine that the resistance component is relatively small, and transmit fail prediction information indicating that the program fail probability is relatively low to the memory controller 200. As used herein, the terms "connected to" and "coupled to" are used interchangeably. The term "connected to" does not require a direct connection between two elements unless such meaning is required from the context.

When the resistance component of the word line is relatively large, a threshold voltage of the memory cell may be abnormally increased when an operation voltage, such as a program voltage, is applied to the word line. When the resistance component of the word line is relatively large, the threshold voltage of the memory cell may increase by an amount less than when the resistance component of the word line is relatively small. Therefore, when the resistance component of the word line is relatively large, the probability of program failure may be relatively high.

When the resistance component of the bit line is relatively large, a channel of a cell in a memory cell string may be abnormally pre-charged when the bit line is pre-charged. For example, the channel of a cell in an unselected string may be pre-charged to a program inhibit voltage. The program inhibit voltage may be a power voltage Vcc. When the resistance component of the bit line is relatively large, a channel potential of the unselected string may be inappropriately high, and as a result the threshold voltage of a cell in the unselected string may be altered when it should not be. Therefore, the probability of program failure may be relatively high.

When power is applied to the storage device 50, the memory controller 200 may execute firmware (FW). The firmware FW may include a host interface layer HIL that receives the request input from the host 300 or outputs a response to the host 300, a flash translation layer (FTL) that manages an operation between an interface of the host 300 and an interface of the memory device 100, and a flash interface layer (FIL) that provides a command to the memory device 100 or receive the response from the memory device 100.

The memory controller 200 may receive data and a logical address (LA) from the host 300, and may convert the logical address into a physical address (PA) indicating an address of memory cells in which data included in the memory device 100 is to be stored. The LA may be a logical block address (LBA), and the PA may be a physical block address (PBA).

The memory controller 200 may control the memory device 100 to perform the program operation, the read operation, or the erase operation according to the request of the host 300. During the program operation, the memory controller 200 may provide a program command, the PBA, and data to the memory device 100. During the read operation, the memory controller 200 may provide a read command and the PBA to the memory device 100. During the erase operation, the memory controller 200 may provide an erase command and the PBA to the memory device 100.

The memory controller 200 may control the memory device 100 to perform the program operation, the read operation, or the erase operation by itself regardless of the request from the host 300. For example, the memory controller 200 may control the memory device 100 to perform the program operation, the read operation, or the erase operation used to perform a background operation such as wear leveling, garbage collection, or read reclaim.

In an embodiment, the memory controller 200 may include a target data write controller 210, a pre-data manager 220, and a pre-data storage 230.

The target data write controller 210 may control the memory device 100 to store target data at a target location, which in embodiments may be a physical address. The target data write controller 210 may program the target data at another location when a write operation at the target location fails.

The pre-data manager 220 may control the memory device 100 to manage pre-data (that is, previously-stored data) stored at a pre-data location. The pre-data manager 220 may back up the pre-data stored at the pre-data location before the target data is stored in the target location. Specifically, the pre-data manager 220 may read the pre-data from the pre-data location in the memory device 100 and temporarily store the pre-data in the pre-data storage 230. When the program operation for the target location fails, the pre-data manager 220 may program the backed up pre-data at another location.

The pre-data storage 230 may temporarily store the data read in the pre-data location under control of the pre-data manager 220.

The pre-data may be data stored in the memory device 100 before the target data is stored in the memory device 100.

The host 300 may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

Figure 2:
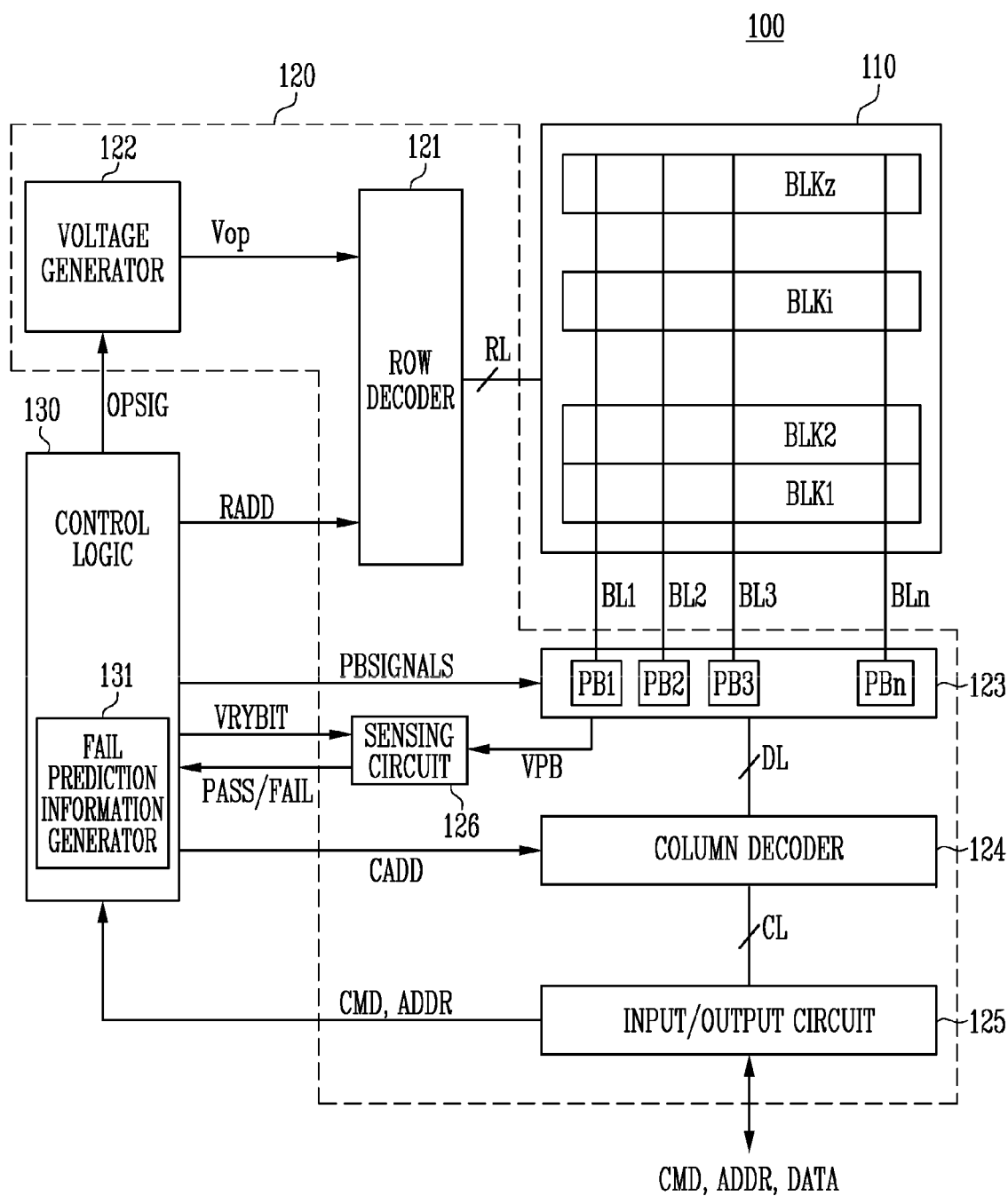
FIG. 2 illustrates a memory device.

FIG. 2 is a diagram for describing the memory device.

Referring to FIG. 2, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are connected to a row decoder 121 through row lines RL. The memory blocks BLK1 to BLKz may be connected to a page buffer group 123 through bit lines BL1 to BLn. Each of the plurality of memory blocks BLK1 to BLKz includes a plurality of memory cells. In an embodiment, the plurality of memory cells are non-volatile memory cells. Memory cells connected to a word line may be referred to as a page, or as a plurality of pages depending on the design of the memory cell array. Thus, one memory block may include a plurality of pages.

The row lines RL may include at least one source select line (SSL), a plurality of word lines, and at least one drain select line (DSL).

Each of the memory cells included in the memory cell array 110 may be configured as a single level cell (SLC) storing one data bit, a multi-level cell (MLC) storing two data bits, a triple level cell (TLC) storing three data bits, or a quad level cell (QLC) storing four data bits.

The peripheral circuit 120 may be configured to perform the program operation, the read operation, or the erase operation on a selected region of the memory cell array 110 under control of the control logic 130. The peripheral circuit 120 may drive the memory cell array 110. For example, the peripheral circuit 120 may apply various operation voltages to the row lines RL and the bit lines BL1 to BLn or discharge the applied voltages under the control of the control logic 130.

The peripheral circuit 120 may include the row decoder 121, a voltage generator 122, the page buffer group 123, a column decoder 124, and an input/output circuit 125.

The row decoder 121 is connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 is configured to operate in response to the control of the control logic 130. The row decoder 121 receives a row address RADD from the control logic 130.

The row decoder 121 is configured to decode the row address RADD. The row decoder 121 selects at least one memory block among the memory blocks BLK1 to BLKz according to a decoded address. In addition, the row decoder 121 may select at least one word line of the memory block selected to apply voltages generated by the voltage generator 122 to at least one word line WL according to the decoded address.

For example, during the program operation, the row decoder 121 may apply a program voltage to a selected word line and apply a program pass voltage of a level lower than that of the program voltage to unselected word lines. During a program verification, the row decoder 121 may apply a verify voltage to the selected word line and apply a verify pass voltage higher than the verify voltage to the unselected word lines. During the read operation, the row decoder 121 may apply a read voltage to the selected word line and apply a read pass voltage higher than the read voltage to the unselected word lines.

In an embodiment, the erase operation of the memory cell array 110 is performed in a memory block unit. During the erase operation, the row decoder 121 may select one memory block according to the decoded address. During the erase operation, the row decoder 121 may apply a ground voltage to word lines connected to the selected memory block.

The voltage generator 122 operates in response to the control of the control logic 130. The voltage generator 122 is configured to generate a plurality of voltages using an external power voltage supplied to the memory device. Specifically, the voltage generator 122 may generate various operation voltages Vop used in the program, read, and erase operations in response to operation signal OPSIG. For example, the voltage generator 122 may generate a program voltage, a verify voltage, a pass voltage, a read voltage, an erase voltage, and the like in response to the control of the control logic 130.

In an embodiment, the voltage generator 122 may generate an internal power voltage by regulating an external power voltage. The internal power voltage generated by the voltage generator 122 is used as an operation voltage of the memory cell array 110.

In an embodiment, the voltage generator 122 may generate a plurality of voltages using an external power voltage or an internal power voltage.

For example, the voltage generator 122 may include a plurality of pumping capacitors that receive the internal power voltage, and selectively activate the plurality of pumping capacitors in response to the control of the control logic 130 to generate the plurality of voltages.

The generated plurality of voltages may be supplied to the memory cell array 110 by the row decoder 121.

The buffer group 123 includes first to n-th page buffers PB1 to PBn. The first to n-th page buffers PB1 to PBn are connected to the memory cell array 110 through the first to n-th bit lines BL1 to BLn, respectively. The first to n-th page buffers PB1 to PBn operate under the control of the control logic 130. Specifically, the first to n-th page buffers PB1 to PBn may operate in response to page buffer control signals PBSIGNALS. For example, the first to n-th page buffers PB1 to PBn may temporarily store data received through the first to n-th bit lines BL1 to BLn, or may sense a voltage generated by a current flowing in the bit lines BL1 to BLn during the read operation or the program verification.

Specifically, during the program operation, when a program pulse is applied to the selected word line, the first to n-th page buffers PB1 to PBn may transfer data DATA, which is received through the data input/output circuit 125, to selected memory cells through the first to n-th bit lines BL1 to BLn. The memory cells of the selected page are programmed according to the transferred data DATA. A memory cell connected to a bit line to which a program permission voltage (for example, the ground voltage) is applied may have its threshold voltage increased. A threshold voltage of a memory cell connected to a bit line to which a program inhibit voltage (for example, the power voltage) is applied may be maintained. During the program verification, the first to n-th page buffers PB1 to PBn read page data from the selected memory cells through the first to n-th bit lines BL1 to BLn.

During the read operation, the first to n-th page buffers PB1 to PBn read the data DATA from the memory cells of a selected page through the first to n-th bit lines BL1 to BLn, and outputs the read data DATA to the data input/output circuit 125 under control of the column decoder 124.

During the erase operation, the first to n-th page buffers PB1 to PBn may float the first to n-th bit lines BL1 to BLn.

The column decoder 124 may transfer data between the input/output circuit 125 and the page buffer group 123 in response to the column address CADD. For example, the column decoder 124 may exchange data with the first to n-th page buffers PB1 to PBn through data lines DL or may exchange data with the input/output circuit 125 through column lines CL.

The input/output circuit 125 may provide the command CMD and the address ADDR received from the memory controller 200 described with reference to FIG. 1 to the control logic 130, or may exchange the data DATA with the column decoder 124.

The sensing circuit 126 may generate a reference current in response to a permission bit signal VRYBIT during the read operation or the program verification, and may compare a sensing voltage VPB received from the page buffer group 123 with a reference voltage generated by the reference current to output a pass signal PASS or a fail signal FAIL.

The control logic 130 may output the operation signal OPSIG, the row address RADD, the page buffer control signals PBSIGNALS, and the permission bit signal VRYBIT in response to the command CMD and the address ADDR to control the peripheral circuit 120. In addition, the control logic 130 may determine whether the program verification has passed or failed in response to the pass or fail signal PASS or FAIL.

In an embodiment, the control logic 130 may include fail prediction information generator 131.

The fail prediction information generator 131 may generate fail prediction information in response to a fail prediction request received from the pre-data manager 220 of FIG. 1. The fail prediction information may be information indicating the fail probability of the program operation. The fail prediction request may be included in a status read command or a read command.

The fail prediction information generator 131 may provide fail prediction information to the memory controller 200 from a status register (not shown) included in the control logic 130. Alternatively, the fail prediction information generator 131 may provide the fail prediction information temporarily stored in the page buffer group 123 to the memory controller 200.

The fail prediction information may be generated based on data sensed through a bit line when the pass voltage is applied to all word lines. Data sensed through a bit line through which the current greater than the reference current flows may be different from data sensed through a bit line through which the current equal to or less than the reference current flows. Therefore, the fail probability of the target location may be determined through the data sensed through the bit lines connected to the target location.

The fail prediction information generator 131 may generate the fail prediction information based on the data sensed from the bit line and provide the fail prediction information to the memory controller 200. The fail prediction information may be generated based on the current flowing through the bit line, but an embodiment of the present disclosure is not limited thereto. For example, the fail prediction information generator 131 may generate the fail prediction information based on a comparison result between a current flowing through the word line and the reference current.

Figure 3:
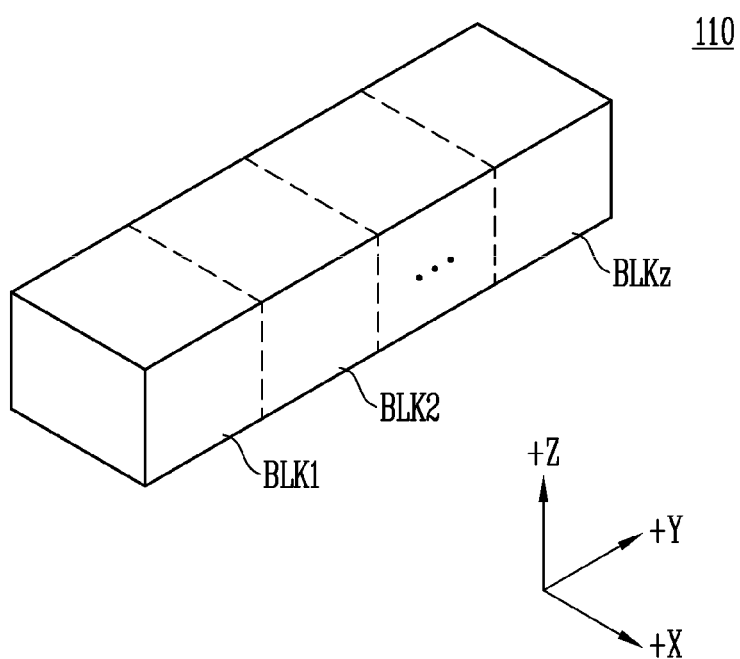
FIG. 3 illustrates an embodiment of a memory cell array of FIG. 2.

FIG. 3 is a diagram illustrating an embodiment of the memory cell array of FIG. 2.

Referring to FIG. 3, the memory cell array 110 includes a plurality of memory blocks BLK1 to BLKz. Each memory block has a three-dimensional structure. Each memory block includes a plurality of memory cells stacked on a substrate. The plurality of memory cells is arranged along a +X direction, a +Y direction, and a +Z direction. A structure of each memory block according to embodiments is described in more detail with reference to FIGS. 4 to 6.

Figure 4:
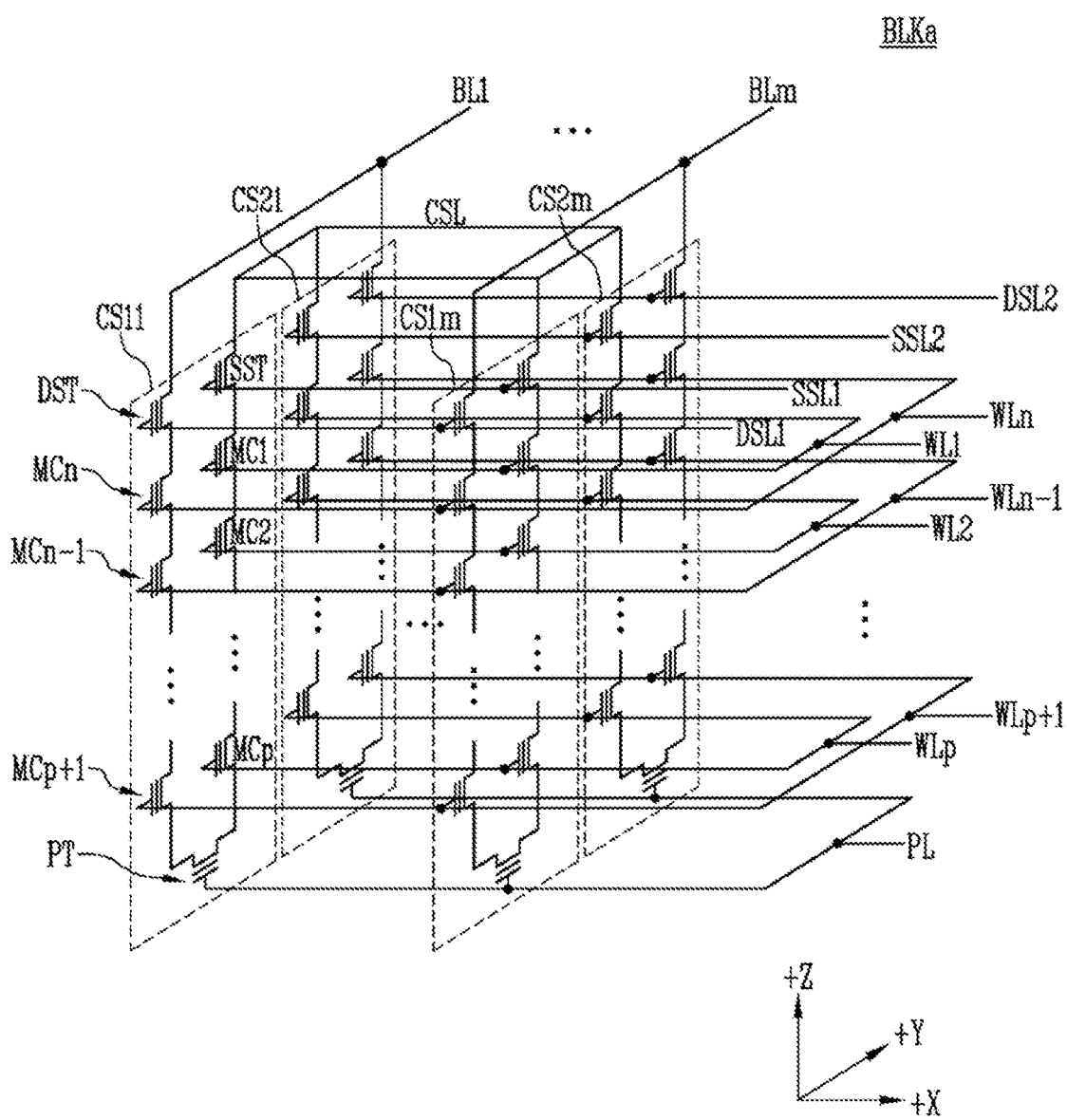
FIG. 4 illustrates a memory block BLKa among memory blocks BLK1 to BLKz of FIG. 3 according to an embodiment.

FIG. 4 is a circuit diagram illustrating any one memory block BLKa among the memory blocks BLK1 to BLKz of FIG. 3 according to an embodiment.

The memory block BLKa includes a plurality of cell strings CS11 to CS1m and CS21 to CS2m. Each of the plurality of cell strings CS11 to CS1m and CS21 to CS2m may be formed in a 'U' shape. In the memory block BLKa, m cell strings are arranged in a row direction (that is, the +X direction), and two cell strings are arranged in a column direction (that is, the +Y direction). However, this is for convenience of description and it may be understood that three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating film, a charge storage film, and a blocking insulating film. In an embodiment, a pillar for providing the channel layer may be provided in each cell string. In an embodiment, a pillar for providing at least one of the channel layer, the tunneling insulating film, the charge storage film, and the blocking insulating film may be provided in each cell string. The select transistors SST and DST and the pipe transistors PT each may include a tunneling layer and the charge storage film, but embodiments are not limited thereto.

The source select transistor SST of each cell string is connected between a common source line CSL and the memory cells MC1 to MCp.

In an embodiment, the source select transistors of the cell strings arranged in the same row are connected to a source select line extending in the row direction, and the source select transistors of the cell strings arranged in different rows are connected to different source select lines. In FIG. 4, the source select transistors of the cell strings CS11 to CS1m of a first row are connected to a first source select line SSL1. The source select transistors of the cell strings CS21 to CS2m of a second row are connected to a second source select line SSL2.

In another embodiment, the source select transistors of the cell strings CS11 to CS1m and CS21 to CS2m may be commonly connected to one source select line.

The first to n-th memory cells MC1 to MCn of each cell string are connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a direction opposite to the +Z direction, and are connected in series between the source select transistor SST and the pipe transistor PT. The (p+1)-th to n-th memory cells MCp+1 to MCn are sequentially arranged in the +Z direction, and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each cell string are connected to the first to n-th word lines WL1 to WLn, respectively.

A gate of the pipe transistor PT of each cell string is connected to a pipe select line PL.

The drain select transistor DST of each cell string is connected between a corresponding bit line and the memory cells MCp+1 to MCn. The cell strings arranged in the row direction are connected to the drain select line extending in the row direction. The drain select transistors of the cell strings CS11 to CS1m of the first row are connected to a first drain select line DSL1. The drain select transistors of the cell strings CS21 to CS2m of the second row are connected to a second drain select line DSL2.

The cell strings arranged in the column direction are connected to the bit lines extending in the column direction. In FIG. 4, the cell strings CS11 and CS21 of the first column are connected to the first bit line BL1. The cell strings CS1m and CS2m of the m-th column are connected to the m-th bit line BLm.

The memory cells connected to the same word line in the cell strings arranged in the row direction configure one page. For example, the memory cells connected to the first word line WL1 among the cell strings CS11 to CS1m of the first row configure one page, and the memory cells connected to the first word line WL1 among the cell strings CS21 to CS2m of the second row configure another page. That is, a plurality of pages may be connected to one word line.

The cell strings arranged in one row direction may be selected by selecting any one of the drain select lines DSL1 and DSL2. The control logic 130 may select one of the drain select lines by controlling the peripheral circuit to apply a select voltage to the drain select lines. That is, the select voltage may be applied to the selected drain select line, and a non-select voltage may be applied to the unselected drain select line. One page of the selected cell strings may be selected by selecting any one of the word lines WL1 to WLn. That is, as any one of the drain selection lines is selected, any one page among a plurality of pages connected to one word line may be selected.

A word line portion connected to each page may be a logical word line. For example, a word line connected to the gates of the n-th memory cells MCn included in the cell strings CS11 to CS1m of the first row may be a first logical word line. For example, a word line connected to the gates of the first memory cells MC1 included in the cell strings CS21 to CS2m of the second row may be a second logical word line.

The logical word lines may be connected to a physical word line. For example, the n-th word line WLn may be a common word line connected to the first logical word line and the second logical word line.

For convenience of description, any one of the plurality of pages may be selected by applying the select voltage to the drain select line, any one of the plurality of pages may be selected by applying the select voltage to the source select line.

In another embodiment, even bit lines and odd bit lines may be provided instead of the first to m-th bit lines BL1 to BLm. In addition, even-numbered cell strings among the cell strings CS11 to CS1m or CS21 to CS2m arranged in the row direction may be connected to the even bit lines, and odd-numbered cell strings among the cell strings CS11 to CS1m or CS21 to CS2m arranged in the row direction may be connected to odd bit lines, respectively.

The control logic 130 may sequentially perform program operations on the plurality of pages connected to one word line. For example, the control logic 130 may sequentially perform program operations on two pages connected to the first word line WL1, such as by first programming the page formed by the cells in cell strings CS11 to CS1m that are connected to the first word line WL1, and then programming the page formed by the cells in cell strings CS21 to CS2m that are connected to the first word line WL1.

In an embodiment, at least one of the first to n-th memory cells MC1 to MCn may be used as a dummy memory cell. For example, in an embodiment, at least one dummy memory cell is provided to reduce an electric field between the source select transistor SST and the memory cells MC1 to MCp. In another embodiment, at least one dummy memory cell is provided to reduce an electric field between the drain select transistor DST and the memory cells MCp+1 to MCn. When more dummy memory cells are provided, reliability of an operation for the memory block BLKa is improved, however, the size of the memory block BLKa capable of storing a given amount of data increases. When fewer dummy memory cells are provided, the size of the memory block BLKa capable of storing the given amount of data may be reduced, however, the reliability of the operation for the memory block BLKa may be reduced.

In order to efficiently control at least one dummy memory cell, each of the dummy memory cells may have a required threshold voltage. Before or after an erase operation for the memory block BLKa, program operations for all or a part of the dummy memory cells may be performed. When the erase operation is performed after the program operation is performed, the dummy memory cells may be configured to the required threshold voltage by controlling a voltage applied to dummy word lines connected to the respective dummy memory cells.

Figure 5:
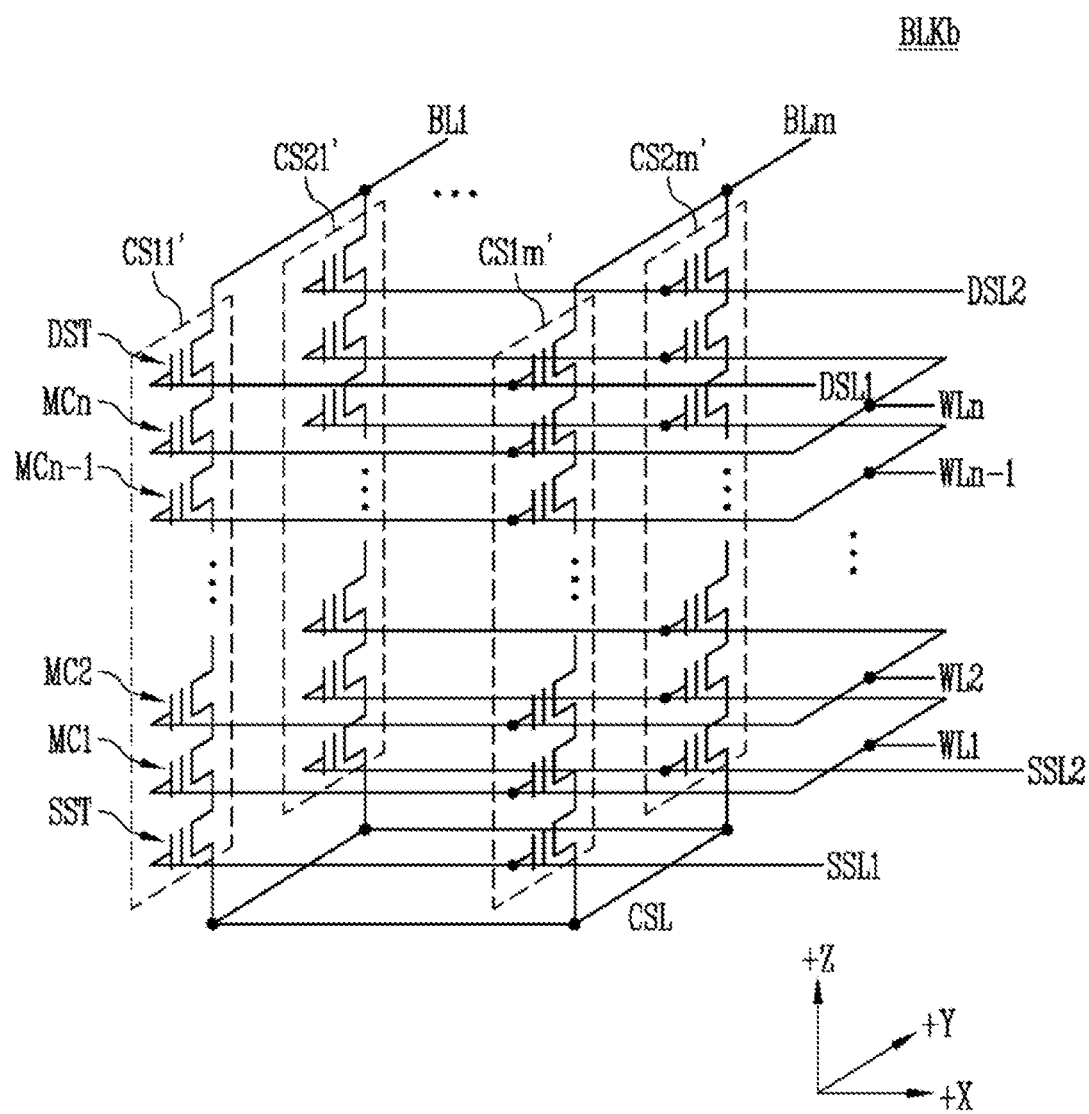
FIG. 5 illustrates a memory block BLKb among the memory blocks BLK1 to BLKz of FIG. 3 according to another embodiment.

FIG. 5 is a circuit diagram illustrating another embodiment of any one memory block BLKb among the memory blocks BLK1 to BLKz of FIG. 3.

The memory block BLKb includes a plurality of cell strings CS11' to CS1m' and CS21' to CS2m'. Each of the plurality of cell strings CS11' to CS1m' and CS21' to CS2m' extends along a +Z direction. Each of the plurality of cell strings CS11' to CS1m' and CS21' to CS2m' includes at least one source select transistor SST, first to n-th memory cells MC1 to MCn, and at least one drain select transistor DST stacked on a substrate (not shown) under the memory block BLKb.

The source select transistor SST of each cell string is connected between a common source line CSL and memory cells MC1 to MCn. The source select transistors of the cell strings arranged in the same row are connected to the same source select line. The source select transistors of the cell strings CS11' to CS1m' arranged in a first row are connected to a first source select line SSL1. The source select transistors of the cell strings CS21' to CS2m' arranged in a second row are connected to a second source select line SSL2. In another embodiment, the source select transistors of the cell strings CS11' to CS1m' and CS21' to CS2m' may be commonly connected to one source select line.

The first to n-th memory cells MC1 to MCn of each cell string are connected in series between the source select transistor SST and the drain select transistor DST. Gates of the first to n-th memory cells MC1 to MCn are connected to first to the n-th word lines WL1 to WLn, respectively.

The drain select transistor DST of each cell string is connected between a corresponding bit line and the memory cells MC1 to MCn. The drain select transistors DST of the cell strings arranged in the row direction are connected to a drain select line extending in the row direction. The drain select transistors of the cell strings CS11' to CS1m' of a first row are connected to a first drain select line DSL1. The drain select transistors of the cell strings CS21' to CS2m' of a second row are connected to a second drain select line DSL2.

As a result, the memory block BLKb of FIG. 5 has an equivalent circuit similar to the memory block BLKa of FIG. 4 except that the pipe transistors PT are not present in each cell string.

Therefore, the memory cells included in the memory block BLKb may be configured as the plurality of pages connected to one word line.

A word line portion connected to each page may be a logical word line. For example, a word line connected to the gates of the n-th memory cells MCn included in the cell strings CS11' to CS1m' of the first row may be a first logical word line, and a word line connected to the gates of the first memory cells MC1 included in the cell strings CS21' to CS2m' of the second row may be a second logical word line.

The logical word lines may be connected to a physical word line. For example, the n-th word line WLn may be a physical word line connected to the first logical word line and the second logical word line.

Program operations may be sequentially performed on the plurality of pages connected to one physical word line. For example, program operations may be sequentially performed on two pages connected to the first word line WL1, similarly to as described above with respect to FIG. 4.

In another embodiment, even bit lines and odd bit lines may be provided instead of the first to m-th bit lines BL1 to BLm. In addition, even-numbered cell strings among the cell strings CS11' to CS1m' or CS21' to CS2m' arranged in the row direction may be connected to even bit lines, and odd-numbered cell strings among the cell strings CS11' to CS1m' or CS21' to CS2m' arranged in the row direction may be connected to odd bit lines, respectively.

In an embodiment, at least one of the first to n-th memory cells MC1 to MCn may be used as a dummy memory cell. For example, at least one dummy memory cell is provided to reduce an electric field between the source select transistor SST and the memory cells MC1 to MCn. In another embodiment, at least one dummy memory cell is provided to reduce an electric field between the drain select transistor DST and the memory cells MC1 to MCn. When more dummy memory cells are provided, reliability of an operation for the memory block BLKb is improved, however, the size of the memory block BLKb capable of storing a given amount of data increases. When fewer dummy memory cells are provided, the size of the memory block BLKb capable of storing the given amount of data may be reduced, however, the reliability of the operation for the memory block BLKb may be reduced.

In order to efficiently control at least one dummy memory cell, each of the dummy memory cells may have a required threshold voltage. Before or after an erase operation for the memory block BLKb, program operations for all or a part of the dummy memory cells may be performed. When the erase operation is performed after the program operation is performed, the dummy memory cells may be configured to the required threshold voltage by controlling a voltage applied to the dummy word lines connected to the respective dummy memory cells.

Figure 6:
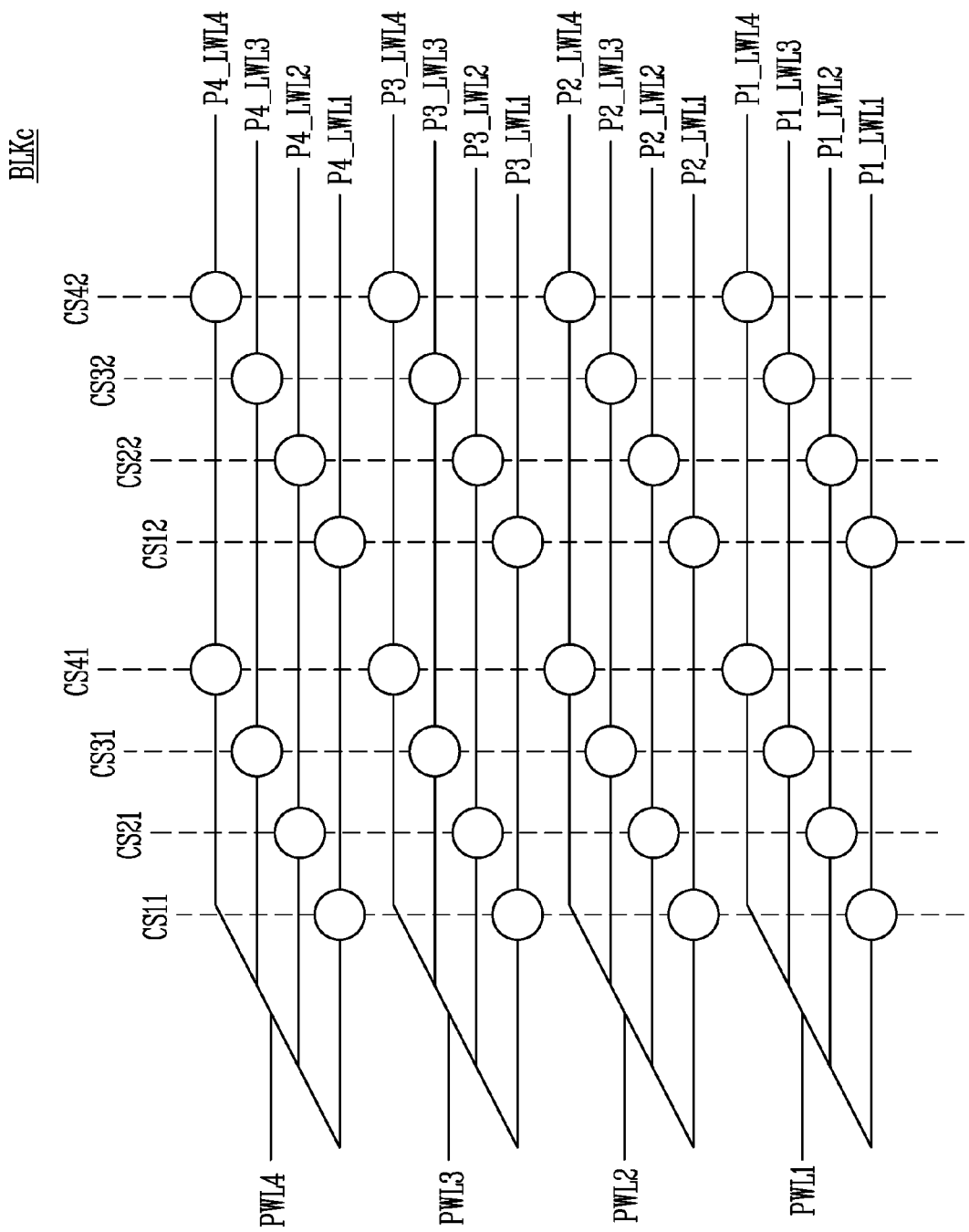
FIG. 6 illustrates a memory block BLKc among the memory blocks BLK1 to BLKz of FIG. 3 according to another embodiment.

FIG. 6 is a circuit diagram illustrating another embodiment of any one memory block BLKc among the memory blocks BLK1 to BLKz of FIG. 3.

Referring to FIG. 6, the memory block BLKc may be connected to a plurality of physical word lines. One physical word line may be commonly connected to four logical word lines. For example, a first physical word line PWL1 may be commonly connected to logical word lines P1_LWL1, P1_LWL2, P1_LWL3, and P1_LWL4. A second physical word line PWL2 may be commonly connected to logical word lines P2_LWL1, P2_LWL2, P2_LWL3, and P2_LWL4. A third physical word line PWL3 may be commonly connected to logical word lines P3_LWL1, P3_LWL2, P3_LWL3, and P3_LWL4. A fourth physical word line PWL4 may be commonly connected to logical word lines P4_LWL1, P4_LWL2, P4_LWL3, and P4_LWL4. Memory cells connected to any one of the logical word lines may configure one page. For example, memory cells connected to logical word line P1_LWL1 may configure one page.

Cell strings CS11, CS21, CS31, and CS41 of the first column may be commonly connected to the same bit line (not shown). The cell strings CS12, CS22, CS32, and CS42 of the second column may be commonly connected to the same bit line (not shown) different from the bit line connected to cell strings CS11 to CS41.

In FIG. 6, a structure in which four strings are connected to the same bit line is described as an example. However, this is for convenience of description, the number of strings commonly connected to the bit line may be less than or greater than four. Specifically, the number of logical word lines connected to one physical word line may be determined according to the number of strings commonly connected to one bit line. For example, when five strings are commonly connected to one bit line, one physical word line may be commonly connected to five logical word lines. In this case, one physical word line may be connected to five pages. A programmed page and a non-programmed page among the five pages may be determined according to a string select signal (for example, signals applied to the drain select line or the source select line of FIG. 4 or 5).

One page may be selected by one logical word line. First to fourth pages may be respectively selected by the logical word lines P1_LWL1 to P1_LWL4. Fifth to eighth pages may be respectively selected by the logical word lines P2_LWL1 to P2_LWL4. Ninth to twelfth pages may be respectively selected by the logical word lines P3_LWL1 to P3_LWL4. Thirteenth to sixteenth pages may be respectively selected by the logical word lines P4_LWL1 to P4_LWL4.

The plurality of pages included in the memory block BLKc may be programmed in a predetermined order. The plurality of pages connected to one physical word line may be sequentially programmed. For example, the first page to fourth page connected to the first physical word line PWL1 may be sequentially programmed. The programmed page among four pages may be determined according to the string select signal (for example, signals applied to the drain select line or the source select line of FIG. 4 or 5).

A memory cells may be disturbed by an operation performed on a near-by memory cell. For example, when a near-by memory cell connected to the same physical word line of the memory cell is programmed, a threshold voltage of the memory cell may by disturbed, that is, abnormally changed. In a 3D memory cell array such as shown in FIGS. 4-6, the near-by memory cell connected to the same physical word line may be connected to a different logical word line, that is, may be in a different page. Accordingly, in the 3D memory cell array, an operation on a first memory cell in a first page may disturb a second memory cell in a second page. Since memory cells connected to the same physical word line are positioned at the same height, widths of the memory cells may be similar. That is, the memory cells connected to the physical word line may have similar cell characteristics. Therefore, when a threshold voltage distribution of the memory cells included in one page is changed, and especially if it is abnormally changed as may occur when a program operation fails, a threshold voltage distribution of the memory cells included in other pages connected to the same physical word line may also be abnormally changed. That is, when the program operation for one page fails, normal data programmed in other pages connected to the same physical word line may also be abnormally changed.

Figure 7:
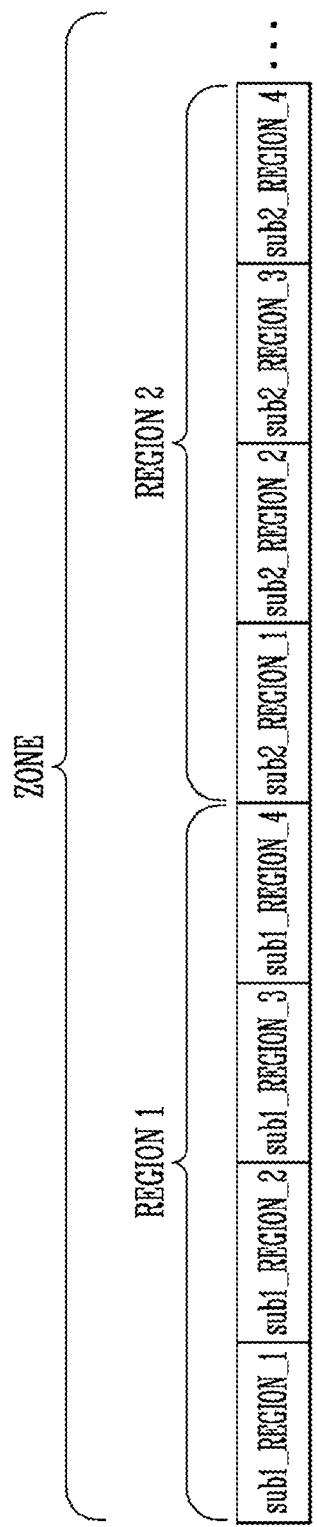
FIG. 7 illustrates a zone according to an embodiment.

FIG. 7 is a diagram for describing a zone ZONE.

The zone ZONE may include a plurality of storage regions. For example, the zone may include a first storage region REGION 1 and a second storage region REGION 2. Each storage region may include a plurality of subregions. For example, the first storage region REGION 1 may include first subregion sub1_REGION_1 to fourth subregion sub1_REGION_4. The second storage region REGION 2 may include first subregion sub2_REGION_1 to fourth subregion sub2_REGION_4. Each subregion may include at least one memory cell. The subregions in a region may comprise memory cells that are physically near to each other, that are at a same height, that share a physical word line, or combinations thereof. Accordingly, a region may be comprised of subregions that have a higher probability (compared to subregions outside that region) of disturbing cells in each other when an operation, such as a program operation, is performed therein.

Each subregion may be a unit of the program operation. For example, each subregion may be a page. The target location may be a subregion programmed in a current program operation. The data stored in the target location may be the target data. The pre-data location may be a subregion programmed in a previous program operation. The data stored in the pre-data location may be the pre-data. The pre-data location and the target location may be positioned in the same zone. The pre-data location and the target location may be consecutive subregions. For example, the pre-data location may be the first subregion sub1_REGION_1, and the target location may be the second subregion sub1_REGION_2.

The memory cell array 110 may be divided into a plurality of zones. A logical address range of data to be stored in each zone may be preset by a request of the host 300. The memory controller 200 may generate the zone according to the request of the host 300 and may preset the logical address range of the data to be stored in the zone.

The generated plurality of zones may be specified by a zone identifier. Specifically, when the host 300 provides the zone identifier to the memory controller 200, the memory controller 200 may control the memory device 100 to sequentially store data in the zone specified by the zone identifier. The memory controller 200 may sequentially correspond a logical address to data received from the host 300 within the logical address range allocated to the zone.

The logical address corresponding to the pre-data location and the logical address corresponding to the target location may be consecutive. For example, a logical address next to the logical address corresponding to the pre-data location may be a logical address corresponding to the target location. Therefore, the pre-data stored in the pre-data location and the target data stored in the target location may be sequential data.

For convenience of description, one memory cell array may be divided into the plurality of zones, but an embodiment is not limited thereto. For example, the zone may include storage regions across a plurality of memory cell arrays.

As described with reference to FIG. 7, when the threshold voltage distribution of the memory cells included in one subregion is abnormally changed, the threshold voltage distribution of the memory cells included in other subregions included in the same storage region may be also abnormally changed. That is, when a program operation for one subregion fails, normal data previously programmed in other subregions included in the same storage region may be abnormally changed (that is, corrupted). In an embodiment, when the program operation on the target location fails, the pre-data stored in the pre-data location may be corrupted.

The target data to be stored in the target location may be temporarily stored in a buffer memory (not shown) included in the memory controller 200. The buffer memory (not shown) may be a volatile memory or a non-volatile memory. Therefore, even when the program operation for the target location fails, the target data may not be lost. However, since the pre-data was programmed in the pre-data location during a previous program operation, the pre-data may not be stored in the buffer memory (not shown) during a current program operation. Therefore, in memories of the related arts, when the program operation for the target location fails, the pre-data may be corrupted or lost.

The storage device 50 according to an embodiment may recover the pre-data even though the pre-data stored in the pre-data location is abnormally changed by backing up the pre-data before performing the program operation on the target location.

Figure 8:
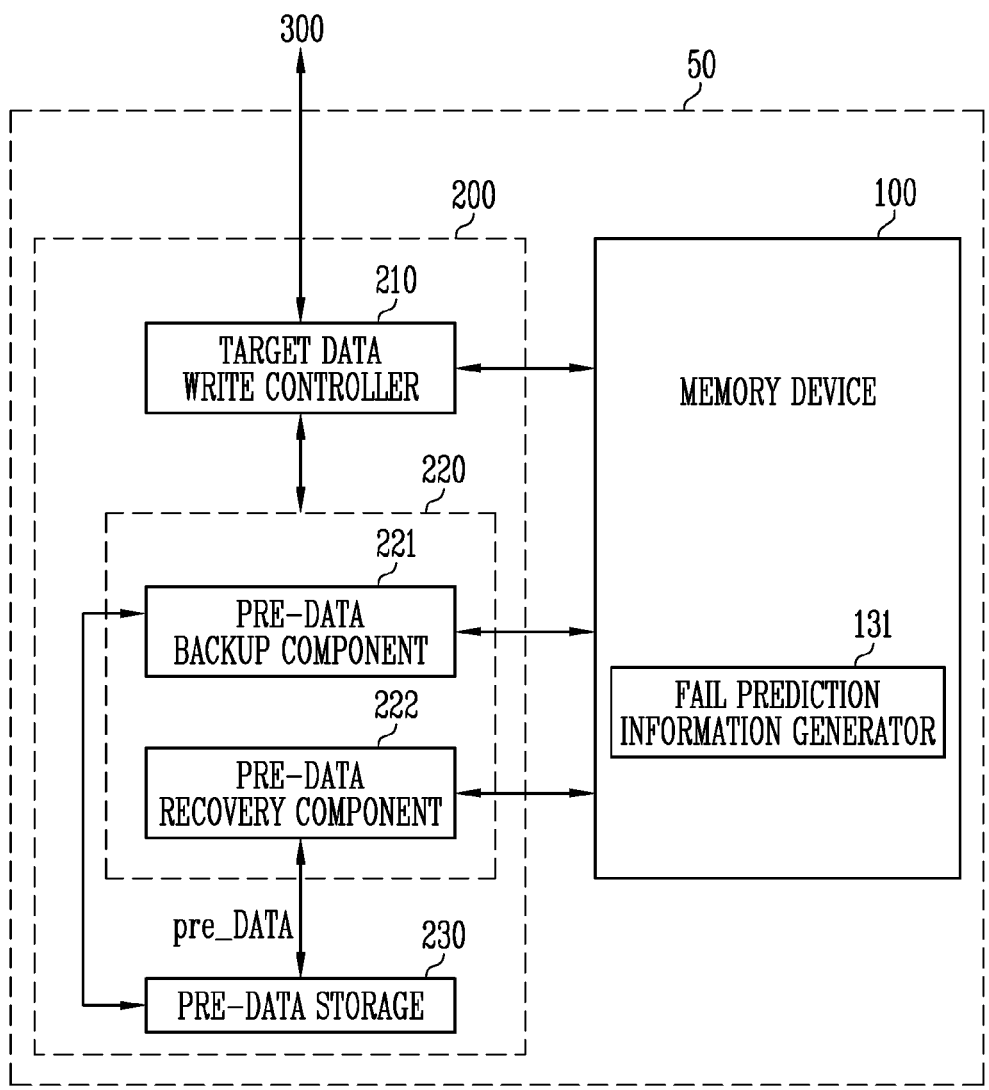
FIG. 8 illustrates a storage device according to an embodiment.

FIG. 8 is a block diagram for describing the storage device according to an embodiment.

Referring to FIG. 8, the memory controller 200 according to an embodiment may include the target data write controller 210, the pre-data manager 220, and the pre-data storage 230. The pre-data manager 220 may include a pre-data backup component 221 and a pre-data recovery component 222. The memory device 100 may include the plurality of zones described with reference to FIG. 7.

The memory controller 200 may receive the zone identifier from the host 300 and control the memory device 100 to sequentially program data in the zone designated by the zone identifier.

Hereinafter, it is assumed that the memory controller 200 controls the memory device 100 to program data in a specific zone.

The target data write controller 210 may receive the target data from the host 300 and control the memory device 100 to program the target data in the target location.

The target data write controller 210 may transmit a confirmation request regarding whether or not to perform the program operation for the target data, to the pre-data manager 220, before the target data is programmed. The target data write controller 210 may control the memory device 100 to program the target data in the target location in response to confirm information received from the pre-data manager 220.

The target location may be any one of the subregions included in the first storage region.

The pre-data backup component 221 may receive the confirmation request from the target data write controller 210 and back up the pre-data stored before the target data to the pre-data storage 230. The pre-data may be data that has been stored in the pre-data location. The pre-data location and the target location may be included in the same zone. The pre-data location and the target location may be included in the same storage region. That is, the pre-data location may be any one or more of the subregions included in the first storage region which includes the target location. The pre-data location and the target location may be different subregions. The pre-data location and the target location may be consecutive subregions. The pre-data backup component 221 may transmit the confirm information to the target data write controller 210 after the pre-data is backed up. The confirm information may be information for allowing the program operation for the target data.

In an embodiment, the pre-data backup component 221 may check whether the program operation for the target location is likely to fail, before backing up the pre-data. Specifically, the pre-data backup component 221 may transmit a fail check command to the memory device 100. The fail check command may be a status read command or a read command.

The memory device 100 may include the fail prediction information generator 131. The fail prediction information generator 131 may generate the fail prediction information in response to the fail check command received from the pre-data backup component 221. The fail prediction information generator 131 may transmit the generated fail prediction information to the pre-data backup component 221.

The fail prediction information may be information indicating a program fail probability.

The fail prediction information generator 131 may generate the fail prediction information based on a resistance component of a bit line or a resistance component of a word line connected to a storage region to be programmed. The fail prediction information generator 131 may measure the current flowing through bit lines and/or word lines connected to memory cells included in the storage region, and determine a value of the resistance component based on the measured current. For example, when the value of the measured current is less than a reference value, the fail prediction information generator 131 may determine that the resistance component is relatively large, and transmit information indicating that the program fail probability is relatively high to the memory controller 200. When the value of the measured current is equal to or greater than the reference value, the fail prediction information generator 131 may determine that the resistance component is relatively small, and transmit information indicating that the program fail probability is relatively low to the memory controller 200.

When the resistance component of the word line is relatively large, a threshold voltage of the memory cell may abnormally increase when an operation voltage is applied to the word line. When the resistance component of the word line is relatively large, the threshold voltage of the memory cell may increase at a rate lower than when the resistance component of the word line is relatively small. Therefore, the probability of program failure may be relatively high.

When the resistance component of the bit line is relatively large, a channel of the memory cell string may be abnormally pre-charged when the bit line is pre-charged. For example, the channel of an unselected string may be pre-charged to a program inhibit voltage. The program inhibit voltage may be a power voltage Vcc. When the resistance component of the bit line is relatively large, a channel potential of the unselected string may increase at a rate lower than when the resistance component of the bit line is relatively small. Therefore, the probability of program failure may be relatively high.

The pre-data backup component 221 may receive the fail prediction information and back up the pre-data accordingly. Specifically, when the pre-data backup component 221 receives the information indicating that the program operation for the target location is likely to fail, the pre-data backup component 221 may back up the pre-data, and then transmit the confirm information to the target data write controller 210. When the pre-data backup component 221 receives the information indicating that the program operation for the target location is likely to succeed, the pre-data backup component 221 may transmit the confirm information to the target data write controller 210 without backing up the pre-data.

The target data write controller 210 may receive the confirm information from the pre-data backup component 221 and control the memory device 100 to program the target data in the target location.

The pre-data recovery component 222 may recover the pre-data based on whether the program operation for the target location failed. Specifically, the pre-data recovery component 222 may transmit the status read command to the memory device 100 to check whether the program operation for the target location failed. The memory device 100 may transmit information regarding whether the program operation has failed (which may be stored in a status register) to the pre-data recovery component 222.

When the program operation for the target location has failed, the pre-data recovery component 222 may control the memory device 100 to store the pre-data, which is stored in the pre-data storage 230, in the second storage region of the memory device 100. The second storage region may be included in the same zone as the first storage region. When the program operation for the target location has failed, the target data write controller 210 may control the memory device to store the target data in the second storage region. The pre-data recovery component 222 and the target data write controller 210 may control the memory device 100 to sequentially store the pre-data and the target data in the second storage region. For example, the pre-data may be stored in the first subregion sub2_REGION_1 of the second storage region, and the target data may be stored in the second subregion sub2_REGION_2 of the second storage region.

The storage device 50 according to an embodiment may restore the pre-data even though the pre-data stored in the pre-data location is abnormally changed, by backing up the pre-data before performing the program operation on the target location.

When the program operation for the target location has completed successfully, the pre-data recovery component 222 may initialize the pre-data storage 230. That is, when the target data is normally programmed in the target location, the pre-data recovery component 222 may delete the backup pre-data, to secure a space where the pre-data may be backed up during a next program operation.

Figure 9:
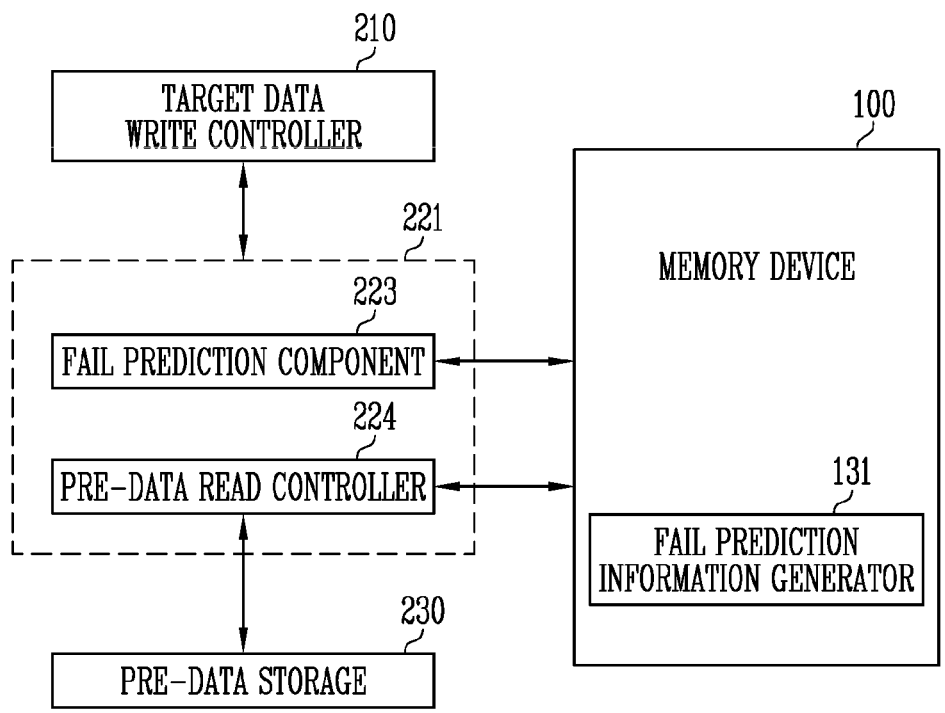
FIG. 9 illustrates a pre-data backup component according to an embodiment.

FIG. 9 is a block diagram for describing the pre-data backup component according to an embodiment.

Referring to FIG. 9, the pre-data backup component 221 may include a fail prediction component 223 and a pre-data read controller 224.

The fail prediction component 223 may receive the confirmation request from the target data write controller 210 and check whether the program operation for the target location is likely to fail. Specifically, the fail prediction component 223 may transmit the fail check command to the memory device 100. The fail check command may be a status read command or a read command. The fail prediction component 223 may receive the fail prediction information from the fail prediction information generator 131 included in the memory device 100, and may transmit a backup start signal for backing up the pre-data to the pre-data read controller 224. Specifically, when the fail prediction information includes information indicating that the program operation for the target location is likely to fail, the fail prediction component 223 may transmit the backup start signal to the pre-data read controller 224. Since the fail prediction information generator 131 has been described with reference to FIG. 7, description thereof will be omitted.

The pre-data read controller 224 may receive the backup start signal and back up the stored pre-data to the pre-data storage 230 before the target data. Specifically, the pre-data read controller 224 may transmit a read command and a physical address corresponding to the pre-data location to the memory device 100, and receive the pre-data in response. The pre-data read controller 224 may back up the read pre-data to the pre-data storage 230.

The pre-data may be data that was programmed in the pre-data location. The pre-data location and the target location may be included in the same zone. The pre-data location and the target location may be included in the same storage region. In an embodiment, the pre-data location may be a subregion included in the first storage region. The pre-data location and the target location may be different subregions. The pre-data read controller 224 may transmit the confirm information to the target data write controller 210 after backing up the pre-data. The confirm information may be information for allowing the program operation for the target data.

The pre-data backup component 221 according to an embodiment may efficiently manage a time required to back up the pre-data by backing up the pre-data when the fail probability of the program operation for the target location is high.

Figure 10:
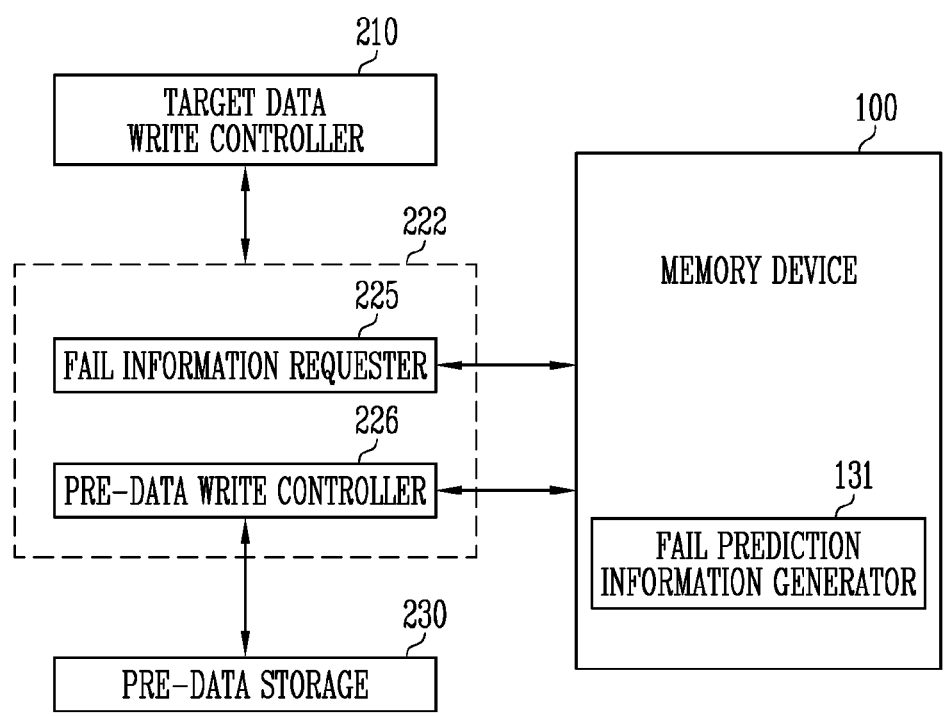
FIG. 10 illustrates a pre-data recovery component according to an embodiment.

FIG. 10 is a block diagram for describing the pre-data recovery component.

Referring to FIG. 10, the pre-data recovery component 222 may include a fail information requester 225 and a pre-data write controller 226.

The fail information requester 225 may check whether the program operation for the target location has failed. Specifically, the fail information requester 225 may provide a command for requesting fail information on whether a write operation for the target location has failed to the memory device 100, and obtain the fail information from the memory device 100. For example, the fail information requester 225 may transmit the status read command to the memory device 100 to check whether the program operation for the target location has failed. The memory device 100 may transmit the fail information on whether the write operation has failed (which may be stored in the status register) to the pre-data recovery component 222.

When the program operation for the target location has failed, the pre-data write controller 226 may control the memory device 100 to store the pre-data stored in the pre-data storage 230 in the second storage region of the memory device 100. The second storage region may be included in the same zone as the first storage region. When the program operation for the target location has failed, the target data write controller 210 may control the memory device to store the target data in the second storage region. The pre-data write controller 226 and the target data write controller 210 may control the memory device 100 to sequentially store the pre-data and the target data in the second storage region. For example, the pre-data may be stored in the first subregion sub2_REGION_1 of the second storage region, and the target data may be stored in the second subregion sub2_REGION_2 of the second storage region.

When the program operation for the target location has succeeded, the pre-data write controller 226 may initialize the pre-data storage 230. That is, when the target data is normally programmed in the target location, the pre-data write controller 226 may delete the backed up pre-data. A space where the pre-data may be backed up at a next program operation may be secured by initializing the pre-data storage 230.

Even when a program operation for the target area fails and causes the pre-data stored in the pre-data location to abnormally change (that is, to become corrupted), the storage device 50 according to an embodiment may perform recovery of the pre-data, even though the storage device 50 does not receive the pre-data from the host 300, by backing up the pre-data before attempting the program operation and then programming the backed-up pre-data to the memory device 100 again after the program operation has failed.

Figure 11:
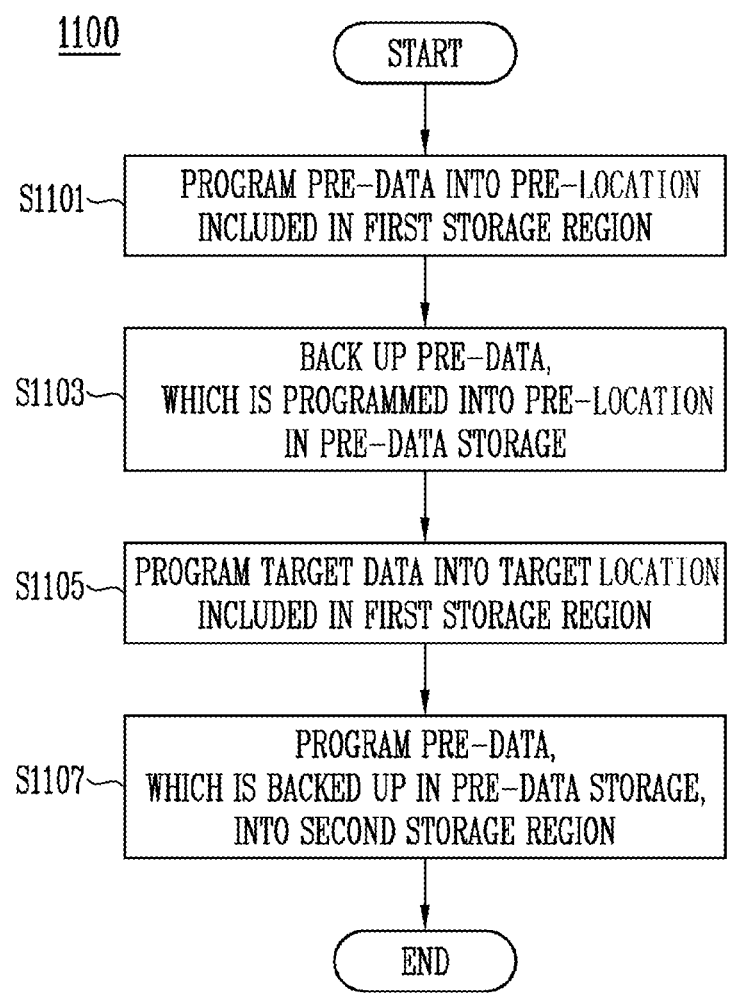
FIG. 11 illustrates a process for operating the storage device according to an embodiment.

FIG. 11 is a flowchart of a process 1100 of operating the storage device. The process 1100 may be performed by the storage device 50.

Referring to FIG. 11, in step S1101, the storage device 50 may program the pre-data into the pre-data location ("pre-location" in FIG. 11) included in the first storage region. The pre-data location may be any one of the plurality of subregions included in a first storage region. The pre-data location may be in a region included in the zone specified by the zone identifier received from the host 300.

In step S1103, the storage device 50 may back up the pre-data programmed into the pre-data location to the pre-data backup component 221. Specifically, the memory controller 200 may transmit the read command and the address corresponding to the pre-data location to the memory device 100, and store the data read from the pre-data location in the pre-data backup component 221.

In step S1105, the storage device 50 may program the target data into the target location included in the first storage region. The logical address corresponding to the target data may be consecutive with the logical address corresponding to the pre-data. The target location may be included in the same zone as the pre-data location. The target location may be included in the same storage region as the pre-data location. The target location may be a subregion different from the pre-data location. A logical address range of data to be stored in the target location and the pre-data location may be preset by the request of the host 300.

In an embodiment, the first storage region may include the memory cells connected to a first physical word line. The first physical word line may be commonly connected to a plurality of logical word lines. The pre-data location and the target location may include respective pluralities of memory cells connected to any one of the plurality of logical word lines connected to the first physical word line.

In another embodiment, the first storage region may be a memory block. The pre-data location and the target location may be respective pages included in the memory block.

In step S1107, the storage device 50 may program the pre-data, which is backed up in the pre-data storage, into the second storage region. In an embodiment, the second storage region may include the memory cells connected to a second physical word line. In another embodiment, the second storage region may be a memory block different from that of the first storage region.

Figure 12:
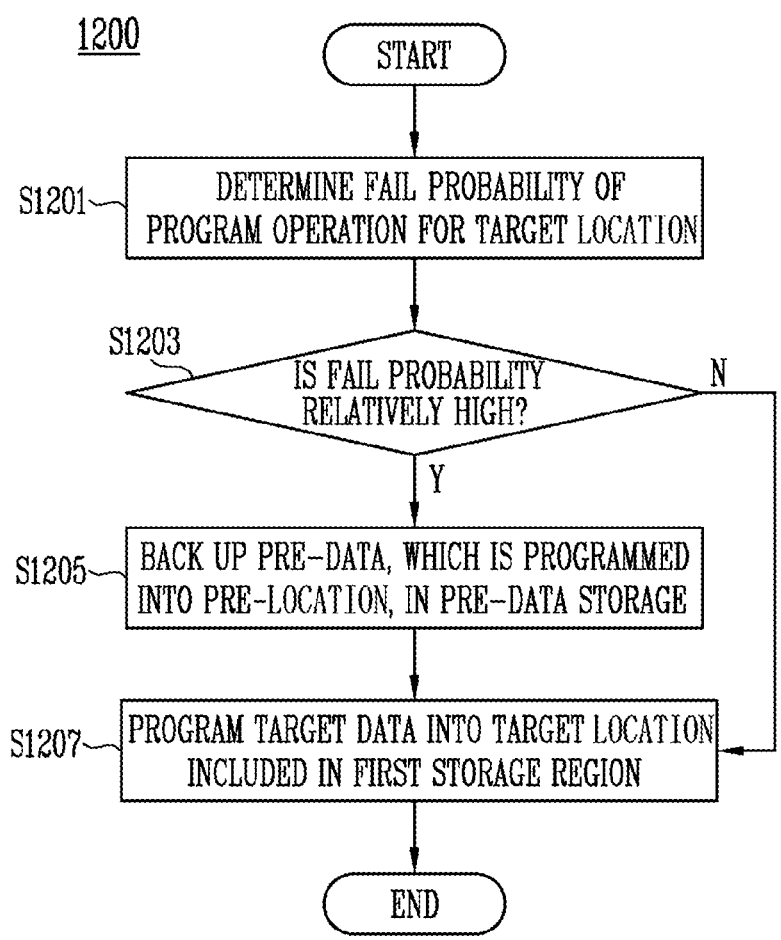
FIG. 12 illustrates a process for backup of pre-data according to an embodiment.

FIG. 12 is a flowchart of a backup process 1200 for backup of the pre-data. The backup process 1200 may be performed by the storage device 50.

Referring to FIG. 12, in step S1201, the storage device 50 may determine the fail probability of the program operation for the target location. Specifically, the storage device 50 may sense the current flowing through the bit lines or the word lines connected to the memory cells included in the target location, and compare the sensed current with the reference current. The storage device 50 may determine the fail probability of the program operation for the target location based on the comparison result. For example, when the value of the sensed current is less than the reference value, the storage device 50 may determine that the fail probability of the program operation is relatively high. When the value of the sensed current is equal to or greater than the reference value, the storage device 50 may determine that the fail probability of the program operation is relatively low.

When the resistance component of the word line is relatively large, the threshold voltage of the memory cell may abnormally increase when the operation voltage is applied to the word line. When the resistance component of the word line is relatively large, the threshold voltage of the memory cell may increase at a rate lower than when the resistance component of the word line is relatively small. Therefore, the probability of program failure may be relatively high.

When the resistance component of the bit line is relatively large, the channel of the memory cell string may be abnormally pre-charged when the bit line is pre-charged. For example, the channel of the unselected string may be pre-charged to the program inhibit voltage. The program inhibit voltage may be the power voltage Vcc. When the resistance component of the bit line is relatively large, the channel potential of the unselected string may increase at a rate lower than when the resistance component of the bit line is relatively small. Therefore, the probability of program failure may be relatively high.

In step S1203, when the fail probability of the program operation for the target location is relatively high, the storage device 50 may proceed to step S1205, and when the fail probability of the program operation for the target location is relatively low, the storage device 50 may proceed to step S1207.

In step S1205, the storage device 50 may back up the pre-data, which is programmed in the pre-data location, in the pre-data storage. That is, when the program operation for the target location has a high probability of failure, the pre-data stored in the pre-data location has a high risk of being changed to abnormal data by the program operation of the target location. Therefore, the storage device 50 may back up the pre-data before the program operation for the target location is performed.

In step S1207, the storage device 50 may program target data into the target location included in the first storage region.

Figure 13:
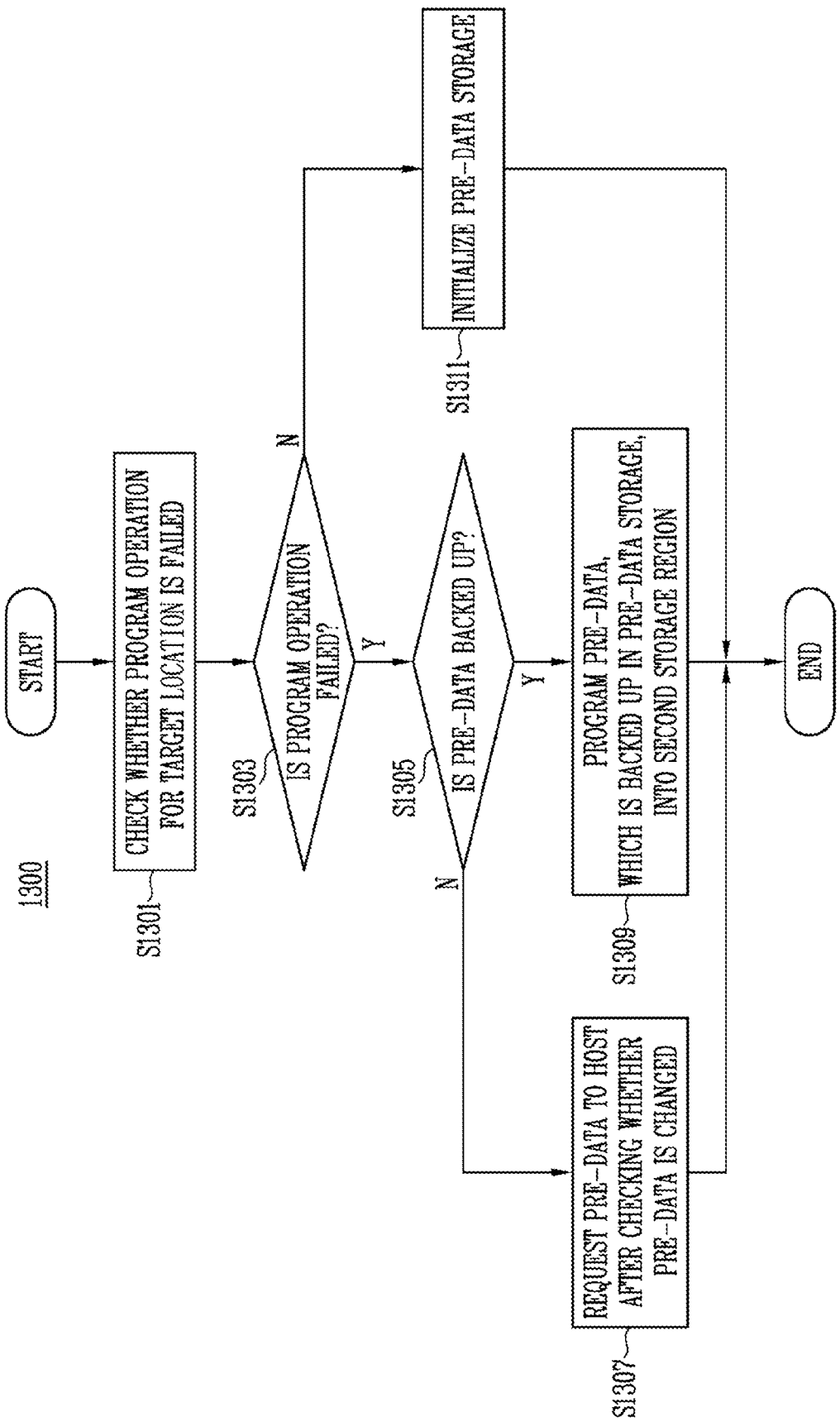
FIG. 13 illustrates a process for recovery of the pre-data according to an embodiment.

FIG. 13 is a flowchart for a recovery process 1300 for recovery of the pre-data. The recovery process 1300 may be performed by the storage device 50.

Referring to FIG. 13, in step S1301, the storage device 50 may check whether the program operation for the target location has failed. For example, the storage device 50 may check whether the program verification has failed in a last program loop. Whether the program operation has failed may be determined by the pass or fail signal output by the sensing circuit 126.

In step S1303, when the program operation has failed, the storage device 50 may proceed to step S1305, and when the program operation has passed, the storage device 50 may proceed to step S1311.

In step S1305, when the pre-data is backed up in the pre-data storage 230, the storage device 50 may proceed to step S1309, and when the pre-data is not backed up in the pre-data storage 230, the storage device 50 may proceed to step S1307.

In step S1309, the storage device 50 may program the pre-data, which is backed up in the pre-data storage 230, into the second storage region. In an embodiment, the second storage region may include the memory cells connected to the second physical word line. In another embodiment, the second storage region may be a memory block different from that of the first storage region.

In step S1307, the storage device 50 may check whether the pre-data stored in the pre-data location is changed. Specifically, the storage device 50 may check whether the number of 0 or the number of 1 included in the pre-data read from the pre-data location is different from a preset number.

When the pre-data stored in the pre-data location is changed, the storage device 50 may send a request for the pre-data to the host 300. Specifically, since the pre-data is not backed up in the storage device 50, the storage device 50 may request the pre-data from the host 300 in order to recover the pre-data.

In step S1311, the storage device 50 may initialize the pre-data storage 230. Specifically, the storage device 50 may delete the pre-data backed up in the pre-data storage 230. The storage device 50 secure a space where another pre-data may be backed up during the next program operation by initializing the pre-data storage 230.

Figure 14:
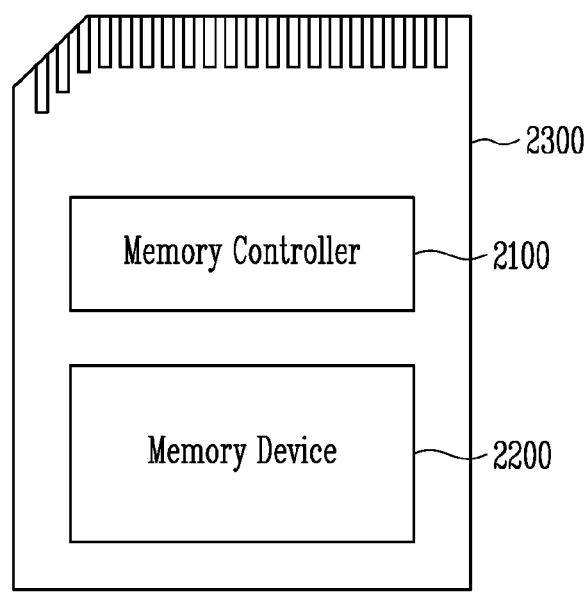
FIG. 14 illustrates a memory card system to which the storage device according to an embodiment of the present disclosure is applied.

FIG. 14 illustrates a memory card system 2000 to which the storage device according to an embodiment of the present disclosure is applied.

The memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and a host. The memory controller 2100 is configured to drive firmware for controlling the memory device 2200.

For example, the memory controller 2100 may include components such as a random access memory (RAM), a processor, a host interface, a memory interface, and an error corrector.

The memory controller 2100 may communicate with an external device through the connector 2300. The memory controller 2100 may communicate with an external device (for example, the host) according to a specific communication standard. For example, the memory controller 2100 is configured to communicate with an external device through at least one of various communication standards such as a universal serial bus (USB), a multimedia card (MMC), an embedded MMC eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), Fire-Wire, a universal flash storage (UFS), Wi-Fi, Bluetooth, and an NVMe. For example, the connector 2300 may be defined by at least one of the various communication standards described above.

For example, the memory device 2200 may be implemented as various non-volatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 15:
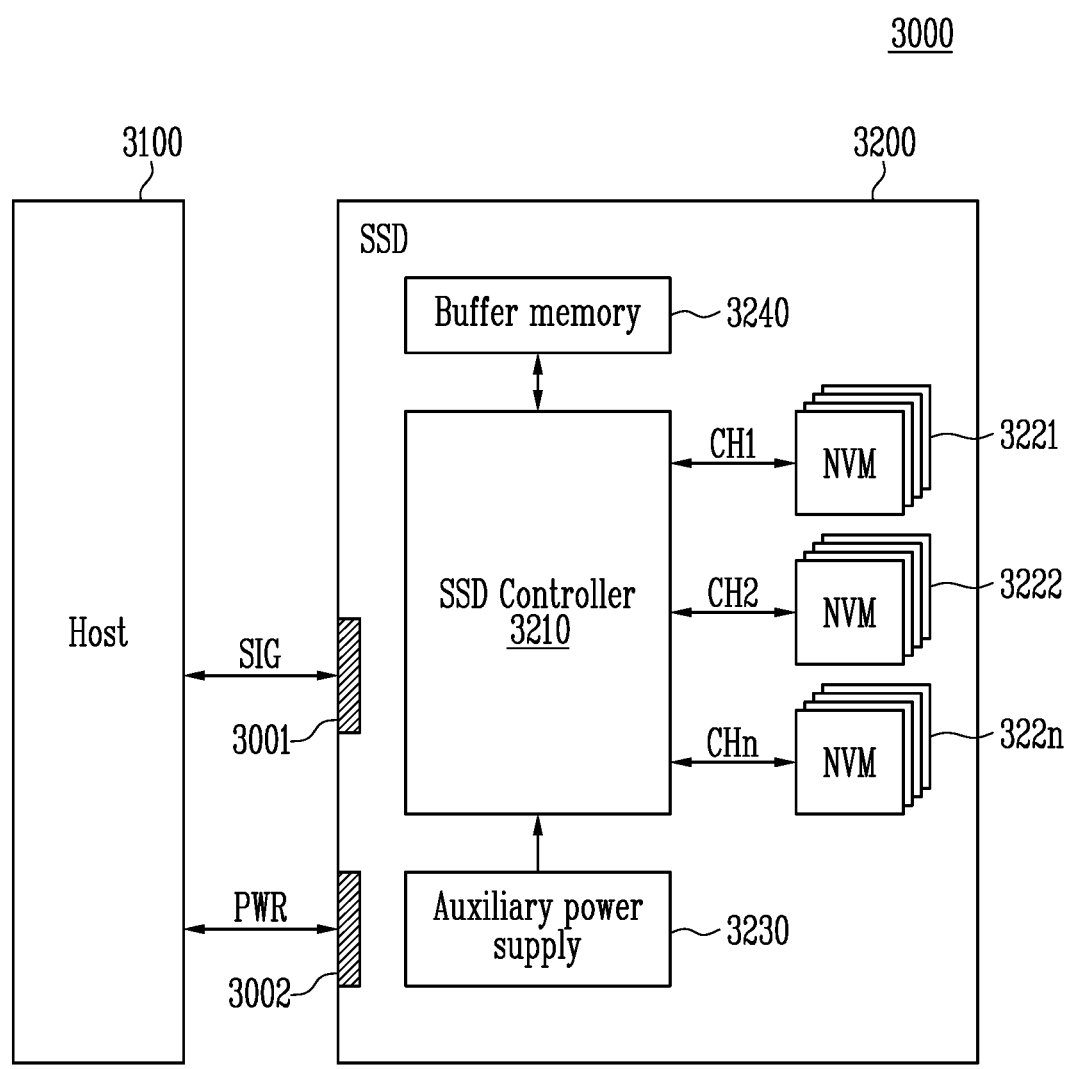
FIG. 15 illustrates a solid state drive (SSD) system to which the storage device according to an embodiment of the present disclosure is applied.

FIG. 15 illustrates a solid state drive (SSD) system 3000 to which the storage device according to an embodiment of the present disclosure is applied.

The SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322n, an auxiliary power device 3230, and a buffer memory 3240.

In an embodiment, the SSD controller 3210 may perform the function of the memory controller 200 described with reference to FIG. 1.

The SSD controller 3210 may control the plurality of flash memories 3221 to 322n in response to the signal SIG received from the host 3100. For example, the signal SIG may be signals based on an interface between the host 3100 and the SSD 3200. For example, the signal SIG may be a signal defined by at least one of interfaces such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power device 3230 is connected to the host 3100 through the power connector 3002. The auxiliary power device 3230 may receive the power PWR from the host 3100 and may charge the power. The auxiliary power device 3230 may provide power of the SSD 3200 when power supply from the host 3100 is not smooth. For example, the auxiliary power device 3230 may be positioned in the SSD 3200 or may be positioned outside the SSD 3200. For example, the auxiliary power device 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store metadata (for example, a mapping table) of the flash memories 3221 to 322n. The buffer memory 3240 may include a volatile memory such as a DRAM, an SDRAM, a DDR SDRAM, an LPDDR SDRAM, and a GRAM, or a non-volatile memory such as an FRAM, a ReRAM, an STT-MRAM, and a PRAM.

Figure 16:
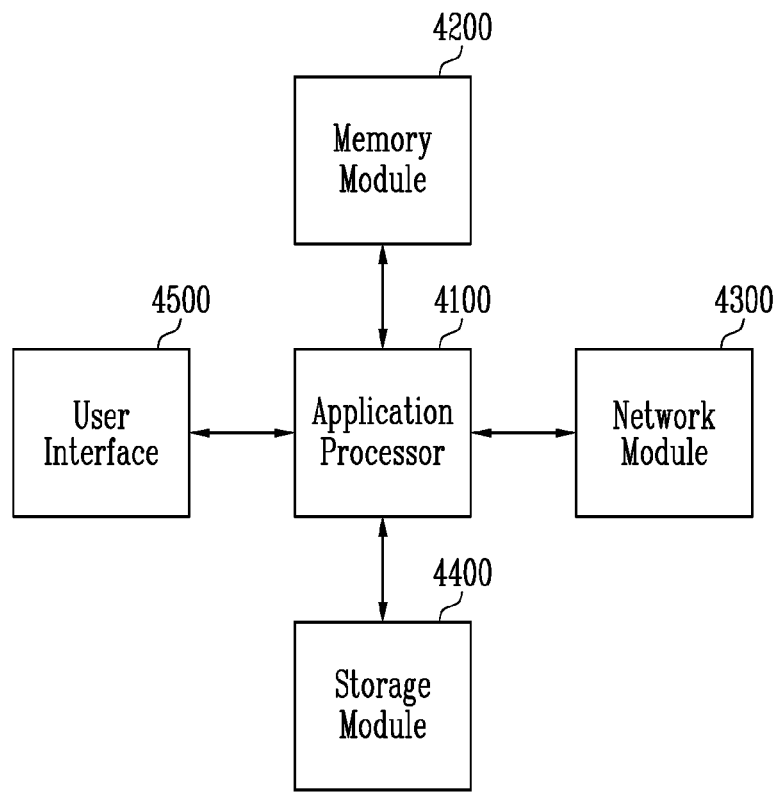
FIG. 16 illustrates a user system to which the storage device according to an embodiment of the present disclosure is applied.

FIG. 16 illustrates a user system 4000 to which the storage device according to an embodiment of the present disclosure is applied.

The user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a non-volatile random access memory, such as a PRAM, a ReRAM, an MRAM, and an FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and Wi-Fi. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented as a non-volatile semiconductor memory element such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable storage device (removable drive), such as a memory card, and an external drive of the user system 4000.

For example, the storage module 4400 may operate identically to the storage device 50 described with reference to FIG. 1.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a motor.

Embodiments improve the reliability of a storage device by providing protection against unintended alteration of values stored in a first memory cell that may be caused by a program operation of a second memory cell in a same region. Embodiments may back up the value stored in the first memory cell when a command to program the second memory cell is received before programming the second memory cell. The backed-up value may then be used to program the value of the first memory cell into another memory cell when the program operation to the second memory cell fails, thus recovering the value of the first memory cell.

Embodiments may back up the value stored in the first memory cell when a prediction of whether the program operation of the second memory cell will fail indicates a high probability that the program operation will fail. The prediction may be based on a measurement of a resistance of a word line associated with the second memory cell or based on a measurement of a resistance of a bit line associated with the second memory cell. The prediction may indicate a high probability that the program operation will fail when the measured resistance is higher than a threshold value.

What is claimed is:

1. A memory controller, comprising:
 a pre-data storage configured to temporarily store data read from a memory device;
 a target data write controller configured to control the memory device to perform a write operation by storing data received from a host in a first subregion of a first storage region included in the memory device; and
 a pre-data manager configured to:
  store pre-data, that is stored in a second subregion of the first storage region, in the pre-data storage before the write operation is performed, and
  based on the write operation having failed, control the memory device to store the pre-data of the pre-data storage in a second storage region included in the memory device.

2. The memory controller of claim 1, wherein the pre-data manager is configured to receive fail prediction information indicating a fail probability of the write operation from the memory device, and to control the memory device to read the pre-data of the second subregion based on the fail prediction information.

3. The memory controller of claim 2, wherein the fail prediction information is determined based on a current flowing through a bit line coupled to the first subregion, a current flowing through a word line coupled to the first subregion, or both.

4. The memory controller of claim 2, wherein the pre-data manager comprises:
 a pre-data backup component configured to store the pre-data of the second subregion in the pre-data storage based on the fail prediction information before the write operation is performed; and
 a pre-data recovery component configured to, based on the write operation having failed, control the memory device to store the pre-data of the pre-data storage in the second storage region.

5. The memory controller of claim 4, wherein the pre-data backup component comprises:
 a fail prediction component configured to provide a command for requesting the fail prediction information to the memory device; and
 a pre-data read controller configured to provide a command for reading the pre-data stored in the second subregion of the first storage region based on the fail prediction information.

6. The memory controller of claim 5, wherein the pre-data recovery component comprises:

a fail information requester configured to provide a command for requesting fail information on whether the write operation on the first subregion has failed; and a pre-data write controller configured to control the memory device to initialize the pre-data storage, or store the pre-data of the pre-data storage in the second storage region, based on the fail information.

7. The memory controller of claim 4, wherein the first storage region and the second storage region are different memory blocks.

8. The memory controller of claim 1, wherein the pre-data storage comprises a volatile memory.

9. The memory controller of claim 1, wherein logical addresses of data to be stored in the first storage region and the second storage region are preset by a request of the host.

10. A storage device, comprising:
a memory device including a first storage region and a second storage region; and
a memory controller configured to:
store data, that is stored in a first subregion of the first storage region, to based on a fail probability of a write operation to be performed on a second subregion of the first storage region;
control the memory device to perform the write operation on the second subregion; and
based on the write operation on the second subregion having failed, control the memory device to store the data of the memory controller in the second storage region.

11. The storage device of claim 10, wherein the memory controller comprises:
a fail prediction component configured to obtain fail prediction information indicating the fail probability of the write operation on the second subregion;
a pre-data storage configured to store the data, that is stored in the first subregion of the first storage region, based on the fail prediction information; and
a target data write controller configured to control the memory device to perform the write operation to store target data in the second subregion.

12. The storage device of claim 11, wherein the memory device is configured to:
compare a current flowing through a bit line connected to the first subregion or through a word line connected to the first subregion with a reference current; and
generate the fail prediction information according to a result of the comparison.

13. The storage device of claim 11, wherein the target data write controller is configured to control the memory device to perform the write operation to store the target data of the memory controller in the second storage region based on the write operation on the second subregion having failed.

14. The storage device of claim 13, further comprising:
a pre-data write controller configured to, based on the write operation on the second subregion having failed, control the memory device to store the data of the memory controller in the second storage region.

15. The storage device of claim 11, wherein the first storage region includes memory cells connected to a physical word line.

16. The storage device of claim 15, wherein the physical word line is connected to a plurality of logical word lines,
first memory cells corresponding to the first subregion are connected to a first logical word line of the plurality of logical word lines, and
second memory cells corresponding to the second subregion are connected to a second logical word line of the plurality of logical word lines.

17. A method of operating a storage device comprising a memory device including a first storage region and a second storage region, the method comprising:
storing pre-data in a first subregion of the first storage region;
determining a fail probability of a write operation on a second subregion of the first storage region after storing the pre-data;
storing the pre-data, that is stored in the first subregion, in a memory controller included in the storage device based on the fail probability;
performing the write operation to store target data in the second subregion; and
based on the write operation having failed, storing the pre-data of the memory controller in the second storage region.

18. The method of claim 17, further comprising:
wherein storing the pre-data comprises storing the pre-data of the memory controller and the target data of the memory controller in the second storage region in response to determining that the write operation failed.

19. The method of claim 17, wherein determining the fail probability comprises:
comparing a current flowing through a bit line connected to the second subregion or through a word line connected to the second subregion with a reference current; and
determining the fail probability of the write operation based on a result of the comparison.

20. The method of claim 17, wherein the first storage region includes memory cells connected to a physical word line,
the physical word line is connected to a plurality of logical word lines,
first memory cells corresponding to the first subregion are connected to a first logical word line of the plurality of logical word lines, and
second memory cells corresponding to the second subregion are connected to a second logical word line of the plurality of logical word lines.

* * * * *